United States Patent
van de Ven et al.

(10) Patent No.: US 9,241,384 B2
(45) Date of Patent: Jan. 19, 2016

(54) SOLID STATE LIGHTING DEVICES WITH ADJUSTABLE COLOR POINT

(71) Applicant: Cree, Inc., Durham, NC (US)

(72) Inventors: Antony Paul van de Ven, Hong Kong (CN); Benjamin A. Jacobson, Chicago, IL (US); Nicholas W. Medendorp, Jr., Raleigh, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 14/260,048

(22) Filed: Apr. 23, 2014

(65) Prior Publication Data

US 2015/0312990 A1    Oct. 29, 2015

(51) Int. Cl.
   *H01J 1/62*    (2006.01)
   *H01J 63/04*   (2006.01)
   *H05B 33/08*   (2006.01)

(52) U.S. Cl.
   CPC .......... *H05B 33/0857* (2013.01); *H05B 33/083* (2013.01); *H05B 33/0815* (2013.01); *H05B 33/0827* (2013.01)

(58) Field of Classification Search
   CPC ..... H01L 25/0753; H01L 33/504; H01J 1/63; F21K 9/56; H05B 33/0803
   USPC ............ 313/498–512; 362/231, 612, 800, 84, 362/230, 249.02
   See application file for complete search history.

(56) References Cited

U.S. PATENT DOCUMENTS

| | | | |
|---|---|---|---|
| 5,350,977 A | 9/1994 | Hamamoto et al. | |
| 5,803,579 A | 9/1998 | Turnbull et al. | |
| 6,234,648 B1 | 5/2001 | Borner et al. | |
| 6,357,889 B1 | 3/2002 | Duggal et al. | |
| 6,441,558 B1 | 8/2002 | Muthu et al. | |

(Continued)

FOREIGN PATENT DOCUMENTS

| | | |
|---|---|---|
| CN | 101539265 A | 9/2009 |
| DE | 10233050 A1 | 2/2004 |

(Continued)

OTHER PUBLICATIONS

U.S. Appl. No. 14/259,993, filed Apr. 23, 2014.

(Continued)

*Primary Examiner* — Thomas A Hollweg
*Assistant Examiner* — Kevin Quarterman
(74) *Attorney, Agent, or Firm* — Withrow & Terranova, P.L.L.C.; Vincent K. Gustafson

(57) ABSTRACT

A solid state lighting device includes multiple solid state light emitters and a control circuit configured to adjust aggregated emissions to produce a mixture of light having an adjustable color point together with high luminous efficacy, wherein at least one color point is on or near the white body line WBL (line of minimum tint). Adjustment of color point may provide substantially constant 1931 CIE x-values; substantially constant 1931 CIE y-values, or substantially constant distance relative to the blackbody locus (e.g., with variation in CCT of at least 100K for the color points). An adjustable color point may be arranged to transition between one point near the BBL and another point on or near the WBL. An adjustable color point may provide a first color point on or near the WBL and another point having different CCT and luminous flux. Emitters selected solely from discrete bins or subregions of a CIE diagram may be used in combination to yield a point on or near the WBL.

37 Claims, 16 Drawing Sheets

(56) References Cited

U.S. PATENT DOCUMENTS

| | | | |
|---|---|---|---|
| 6,498,440 | B2 | 12/2002 | Stam et al. |
| 6,577,073 | B2 | 6/2003 | Shimizu et al. |
| 7,005,679 | B2 | 2/2006 | Tarsa et al. |
| 7,026,756 | B2 | 4/2006 | Shimizu et al. |
| 7,095,056 | B2 | 8/2006 | Vitta et al. |
| 7,213,940 | B1 | 5/2007 | Van De Ven et al. |
| 7,233,831 | B2 | 6/2007 | Blackwell |
| 7,255,457 | B2 | 8/2007 | Ducharme et al. |
| 7,352,138 | B2 | 4/2008 | Lys et al. |
| 7,354,172 | B2 | 4/2008 | Chemel et al. |
| 7,358,679 | B2 | 4/2008 | Lys et al. |
| 7,520,634 | B2 | 4/2009 | Ducharme et al. |
| 7,564,180 | B2 | 7/2009 | Brandes |
| 7,665,865 | B1 | 2/2010 | Hulse et al. |
| 7,687,753 | B2 | 3/2010 | Ashdown |
| 7,744,242 | B2 | 6/2010 | Kramer |
| 7,768,192 | B2 | 8/2010 | Van De Ven et al. |
| 7,781,953 | B2 | 8/2010 | Su |
| 7,791,061 | B2 | 9/2010 | Edmond et al. |
| 7,828,460 | B2 | 11/2010 | Van De Ven et al. |
| 7,845,823 | B2 | 12/2010 | Mueller et al. |
| 7,918,581 | B2 | 4/2011 | Van De Ven et al. |
| 8,038,317 | B2 | 10/2011 | Van De Ven et al. |
| 8,201,966 | B2 | 6/2012 | Hall et al. |
| 8,258,722 | B2 | 9/2012 | Swoboda et al. |
| 8,436,556 | B2 | 5/2013 | Eisele et al. |
| 8,508,127 | B2 | 8/2013 | Negley et al. |
| 8,593,074 | B2 | 11/2013 | Hatley et al. |
| 8,698,388 | B2 | 4/2014 | Cash |
| 2004/0218387 | A1 | 11/2004 | Gerlach |
| 2005/0040774 | A1 | 2/2005 | Mueller et al. |
| 2006/0149607 | A1 | 7/2006 | Sayers et al. |
| 2006/0237636 | A1 | 10/2006 | Lyons et al. |
| 2007/0063321 | A1 | 3/2007 | Han et al. |
| 2007/0152797 | A1 | 7/2007 | Chemel et al. |
| 2007/0223219 | A1 | 9/2007 | Medendorp, Jr. et al. |
| 2007/0241657 | A1 | 10/2007 | Radkov et al. |
| 2008/0130285 | A1 | 6/2008 | Negley et al. |
| 2008/0173884 | A1 | 7/2008 | Chitnis et al. |
| 2008/0179611 | A1 | 7/2008 | Chitnis et al. |
| 2008/0258130 | A1 | 10/2008 | Bergmann et al. |
| 2009/0080185 | A1 | 3/2009 | McMillan |
| 2009/0184616 | A1 | 7/2009 | Van De Ven et al. |
| 2009/0207583 | A1 | 8/2009 | Takano |
| 2009/0227847 | A1 | 9/2009 | Tepper et al. |
| 2009/0296384 | A1* | 12/2009 | Van De Ven et al. ......... 362/231 |
| 2010/0110659 | A1 | 5/2010 | Nakajima |
| 2010/0127283 | A1 | 5/2010 | van de Ven et al. |
| 2010/0254129 | A1 | 10/2010 | Le Toquin et al. |
| 2010/0277907 | A1 | 11/2010 | Phipps et al. |
| 2011/0037388 | A1 | 2/2011 | Lou et al. |
| 2011/0222277 | A1* | 9/2011 | Negley et al. ................ 362/235 |
| 2011/0273079 | A1* | 11/2011 | Pickard et al. ................ 313/483 |
| 2011/0299284 | A1 | 12/2011 | Van De Ven et al. |
| 2012/0112661 | A1* | 5/2012 | van de Ven et al. ........... 315/294 |
| 2012/0229032 | A1 | 9/2012 | Van De Ven et al. |
| 2012/0236553 | A1 | 9/2012 | Cash |
| 2012/0242247 | A1 | 9/2012 | Hartmann et al. |
| 2012/0306375 | A1 | 12/2012 | van de Ven |
| 2013/0020929 | A1* | 1/2013 | van de Ven et al. ........... 313/498 |
| 2013/0114241 | A1 | 5/2013 | van de Ven et al. |
| 2013/0170199 | A1 | 7/2013 | Athalye et al. |
| 2014/0228914 | A1* | 8/2014 | van de Ven et al. ............ 607/88 |

FOREIGN PATENT DOCUMENTS

| | | | |
|---|---|---|---|
| JP | 2003316714 A | 11/2003 | |
| JP | 2004071726 A | 3/2004 | |
| JP | 2005005482 A | 1/2005 | |
| JP | 2005061706 A | 3/2005 | |
| JP | 2009152213 A | 7/2009 | |
| WO | 0034709 A1 | 6/2000 | |
| WO | 2009041171 A1 | 4/2009 | |
| WO | 2013070860 A1 | 5/2013 | |

OTHER PUBLICATIONS

U.S. Appl. No. 14/278,464, filed May 15, 2014.
U.S. Appl. No. 14/298,229, filed Jun. 6, 2014.
U.S. Appl. No. 14/045,474, filed Oct. 3, 2013.
Author Unknown, "CALiPER Retail Lamps Study 3," Solid-State Lighting Program, Feb. 2014, Pacific Northwest National Laboratory, U.S. Department of Energy, 48 pages.
Author Unknown, "LED Color Mixing: Basics and Background," Technical Article, 2010-2013, Cree, Inc., 24 pages.
Narendran, N. et al., "Color Rendering Properties of LED Light Sources," Solid State Lighting II: Proceedings of SPIE, vol. 4776, Nov. 26, 2002, SPIE, 8 pages.
Negley, G. et al., "Essentials of designing efficient luminaires with LEDs," LEDs Magazine, Issue 18, Jan./Feb. 2008, Pennwell Corporation, pp. 17-22.
Rea, Mark S., "Value Metrics for Better Lighting," vol. PM228, 2013, SPIE Press, pp. 36-43, 52-63.
Van De Ven, A. et al., "Warm White illumination with high CRI and high efficacy by combining 455nm excited yellowish phosphor LEDs and red AlInGaP LEDs," First International Conference on White LEDs and Solid State Lighting, Nov. 28, 2007, LED Lighting Fixtures, Inc., 8 pages.
Author Unknown, "What hue does—Ambience," Hue Personal Lighting, Philips Lighting B.V., retrieved Jun. 2, 2015 from http://www2meethue.com/en-us/what-hue-does/ambience/, 2 pages.
Author Unknown, "Hue Personal wireless lighting Single Pack 046677426361 Technical Specifications," Philips Electronics N. V., retrieved Jun. 2, 2015 from http://www.usa.philips.com/c-p/046677426361/hue-personal-wireless-lighting/specifications, 4 pages.
Author Unknown, "Personal wireless lighting 046677426361," Philips Electronics N. V., retrieved Jun. 2, 2015 from http://www.usa.philips.com/c-p/046677426361/hue-personal-wireless-lighting, 7 pages.

* cited by examiner

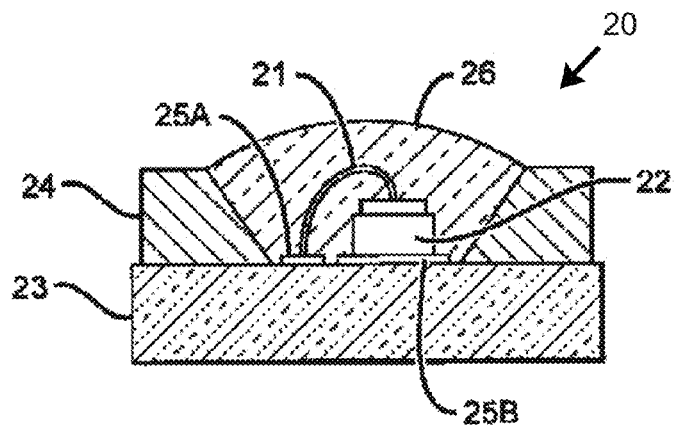
FIG._1 (RELATED ART)
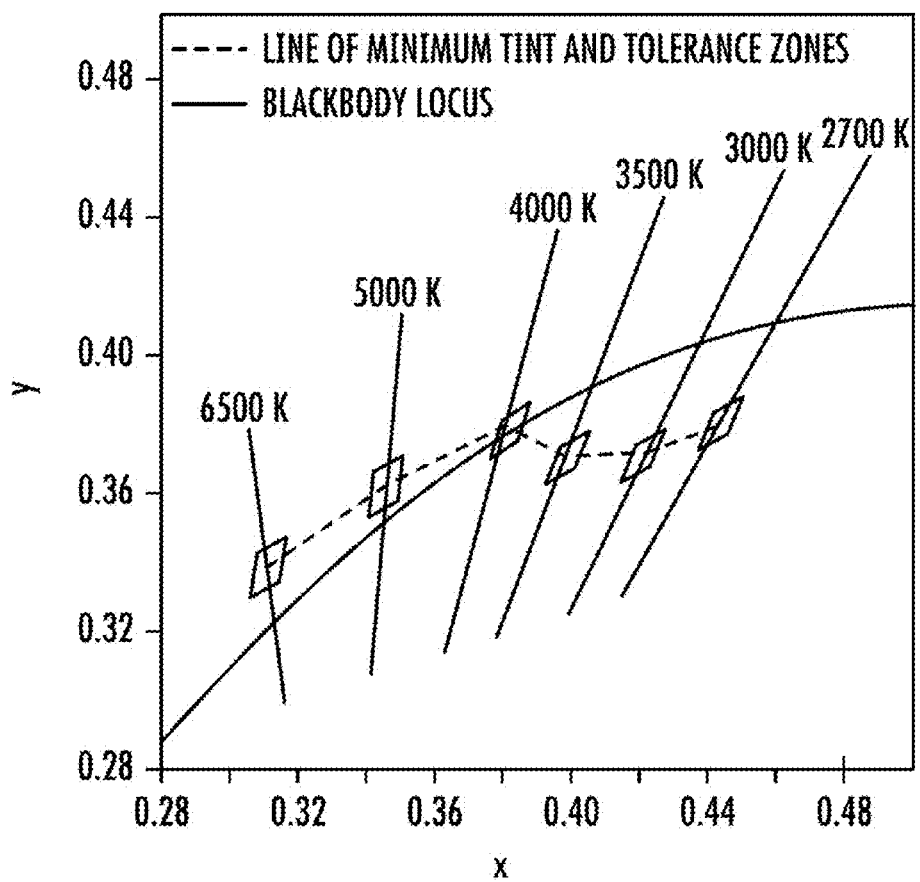
FIG._2 (RELATED ART)

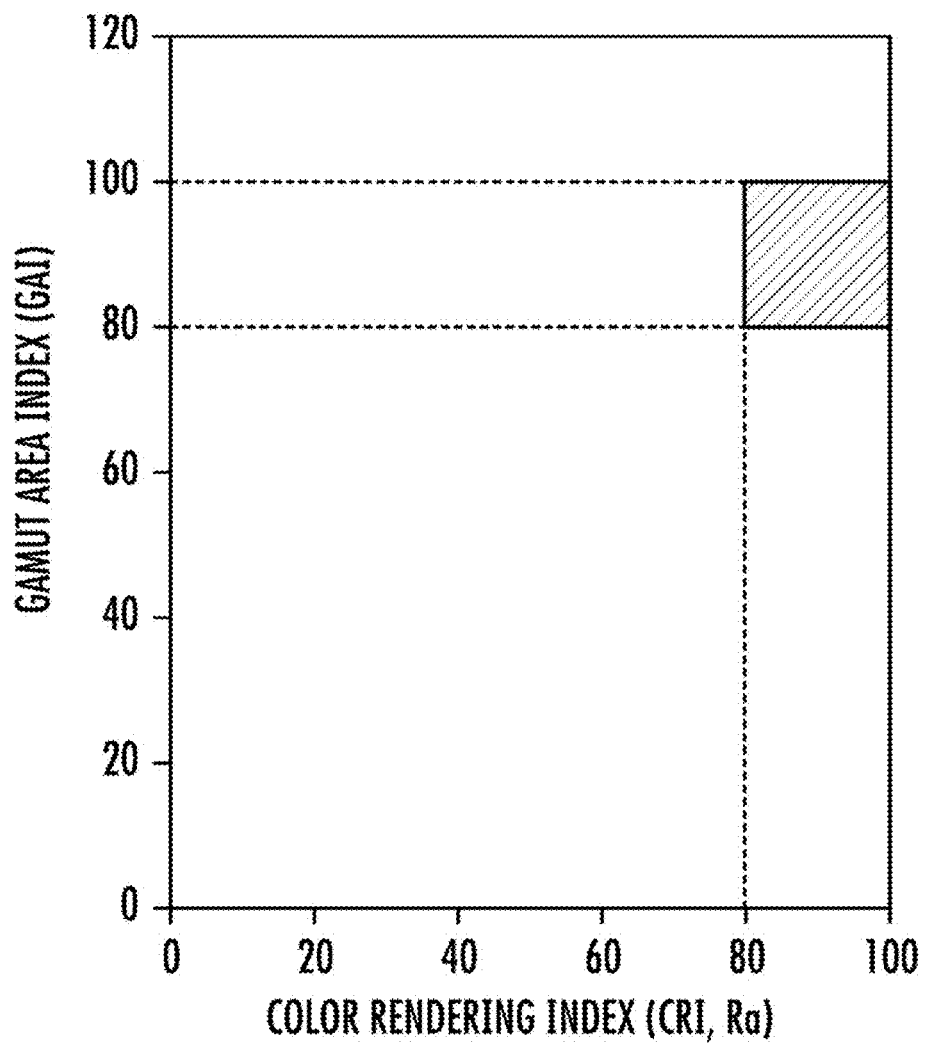
FIG._3
(RELATED ART)

| # | Light source | CCT | CRI | GAI | x | y | System lm/W | S/P |
|---|---|---|---|---|---|---|---|---|
| 1.1 | HPS, 400 W | 2050 | 15 | 14 | 0.5208 | 0.4134 | 96 | 0.66 |
| 1.2 | Pulse-start MH, 320 W | 4159 | 58 | 51 | 0.3799 | 0.3984 | 72 | 1.61 |
| 1.3 | Mercury vapor, 400 W clear | 5891 | 15 | 25 | 0.3191 | 0.4317 | 42 | 1.33 |
| 1.4 | LPS, 180 W | 1785 | −42 | 0 | 0.5681 | 0.4285 | 144 | 0.25 |
| 1.5 | Xenon, 1000 W | 5853 | 97 | 91 | 0.3245 | 0.3439 | 26 | 2.37 |
| 1.6 | White LED, 6500 K | 6528 | 72 | 84 | 0.3116 | 0.3340 | 80 | 2.06 |
| 2.1 | A lamp, 60 W (frosted) | 2764 | 100 | 49 | 0.4535 | 0.4109 | 14 | 1.36 |
| 2.2 | A lamp, 60 W (neodymium doped) | 2789 | 78 | 65 | 0.4460 | 0.3962 | 11 | 1.52 |
| 2.3 | Halogen, 3277 K | 3279 | 100 | 65 | 0.4184 | 0.3969 | 20 | 1.60 |
| 2.4 | CFL, 15 W | 2653 | 83 | 48 | 0.4652 | 0.4141 | 61 | 1.11 |
| 2.5 | Fluorescent, F34T12 cool white | 4022 | 62 | 58 | 0.3833 | 0.3905 | 63 | 1.48 |
| 2.6 | Fluorescent, FO32T8RE835 | 3308 | 86 | 69 | 0.4157 | 0.3939 | 86 | 1.44 |
| 2.7 | Fluorescent, F40T12 daylight | 4861 | 90 | 84 | 0.3502 | 0.3645 | 50 | 1.97 |
| 2.8 | Ceramic MH, 100 W | 4075 | 93 | 80 | 0.3773 | 0.3749 | 66 | 1.79 |
| 2.9 | White LED, 2700 K | 2706 | 84 | 49 | 0.4375 | 0.4072 | 65 | 1.21 |
| 2.10 | White LED, 6500 K | 6528 | 72 | 84 | 0.3116 | 0.3340 | 80 | 2.06 |
| 3.1 | Blue LED, 470-nm peak | N/A | N/A | 4 | 0.1247 | 0.0929 | 10 | 12.79 |
| 3.2 | Fluorescent, F20T12 aquarium lamp | 13408 | 83 | 103 | 0.2676 | 0.2719 | 51 | 2.76 |
| 3.3 | Fluorescent food-display lamp | 3195 | 61 | 128 | 0.3869 | 0.3153 | 36 | 1.97 |

FIG._4A (RELATED ART)

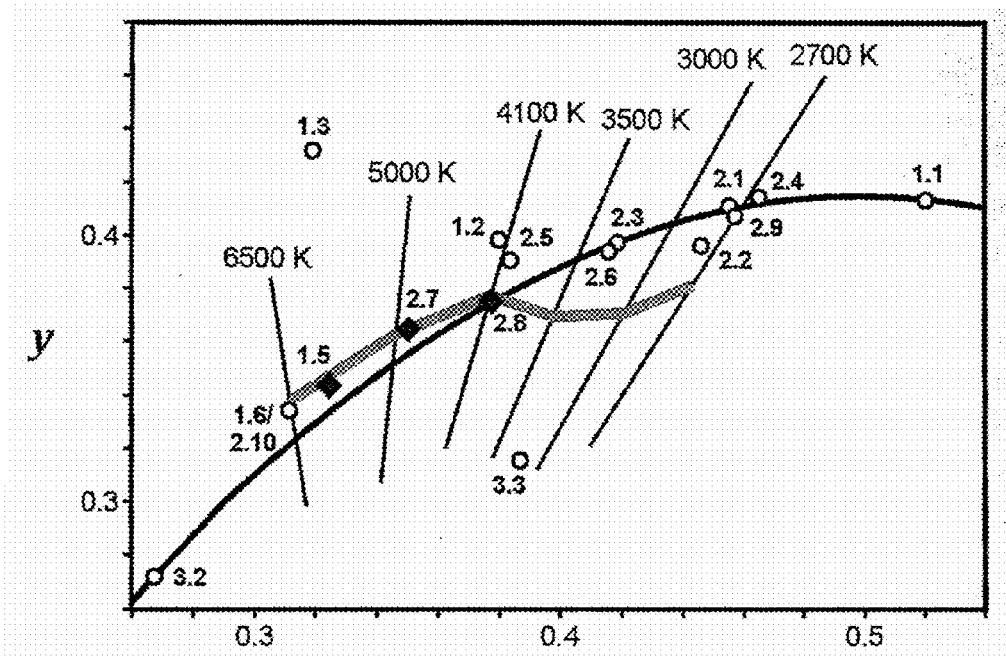

FIG._4B (RELATED ART)

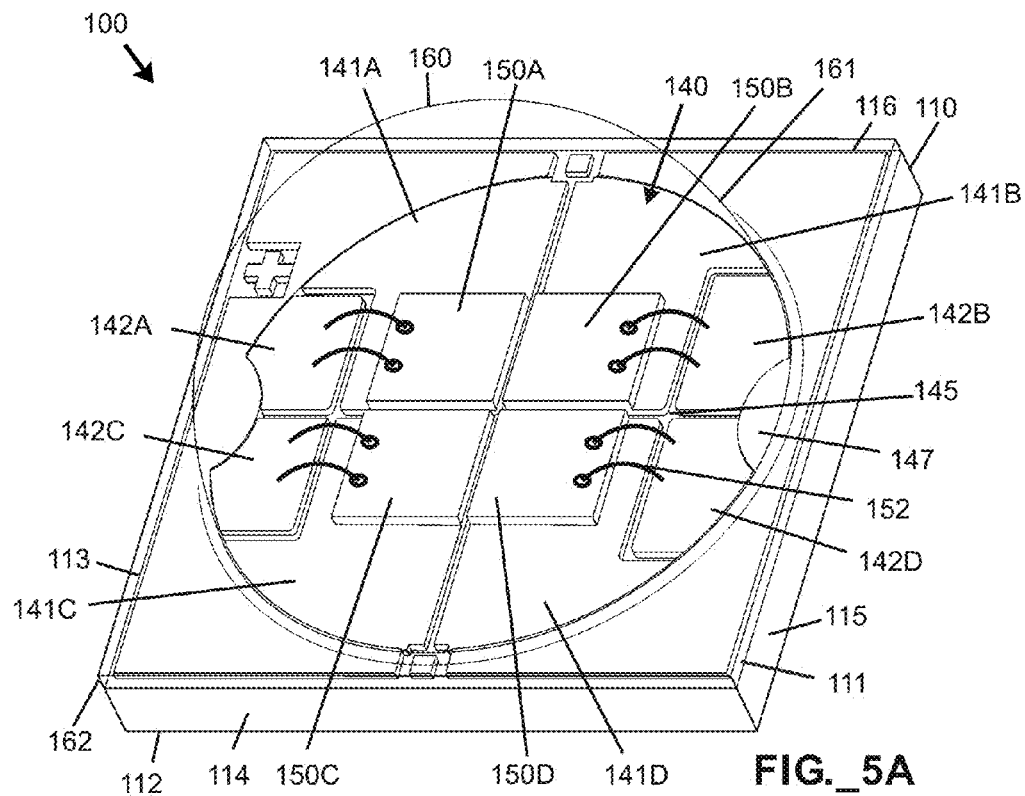
FIG._5A
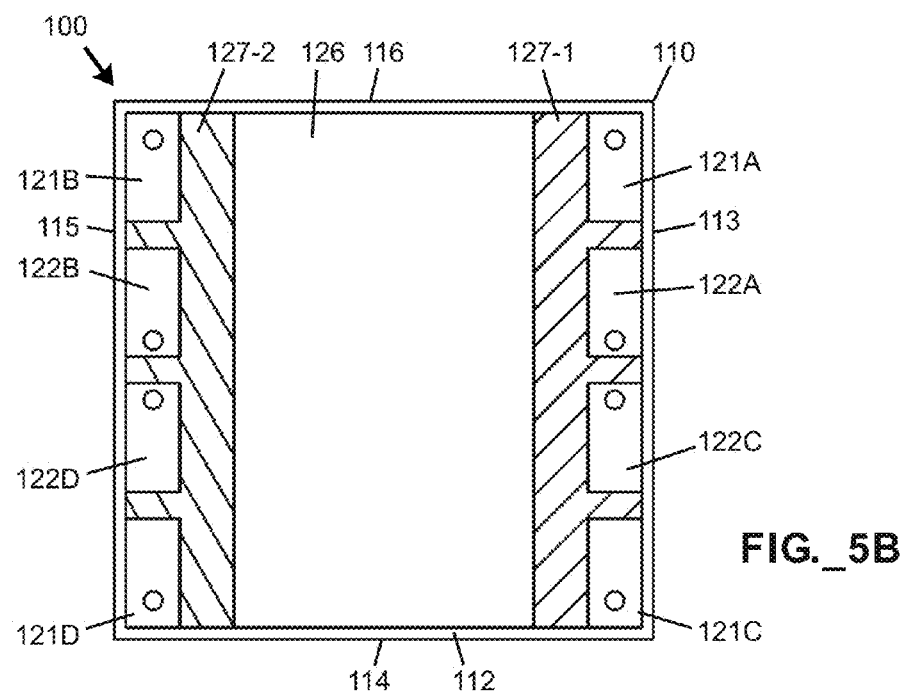
FIG._5B

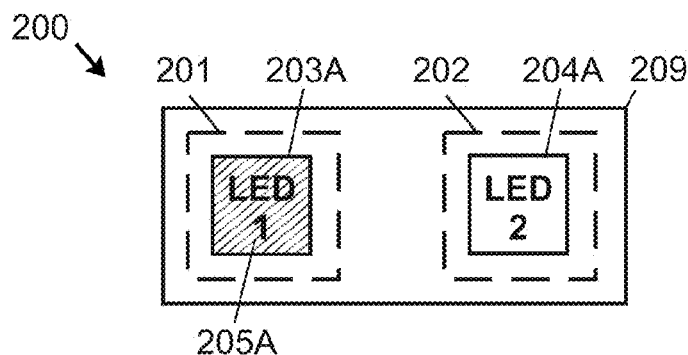
FIG._6A
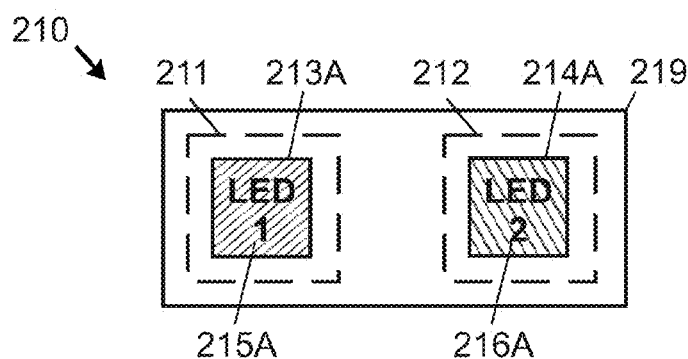
FIG._6B
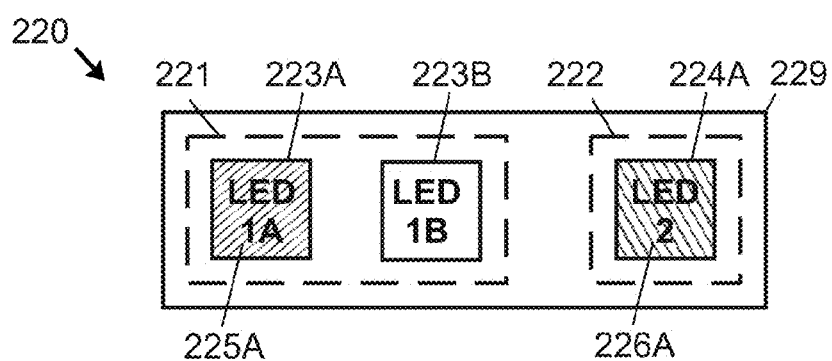
FIG._6C
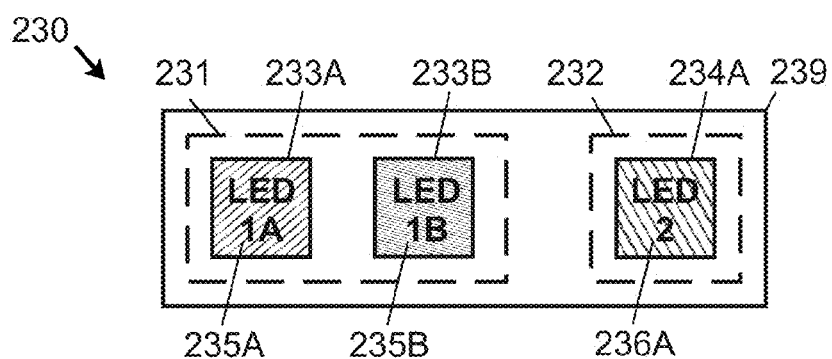
FIG._6D

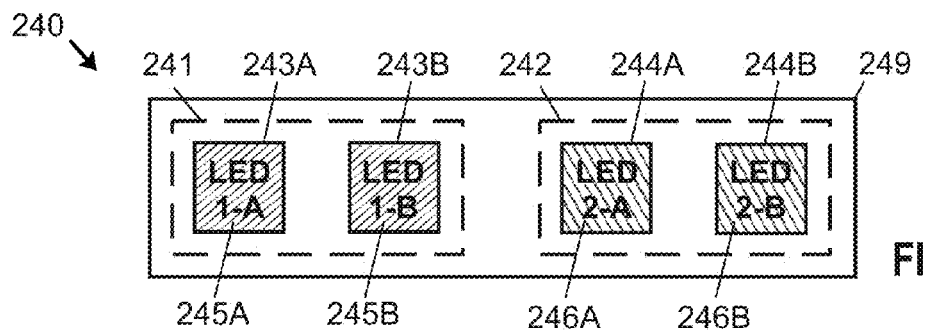
FIG._6E
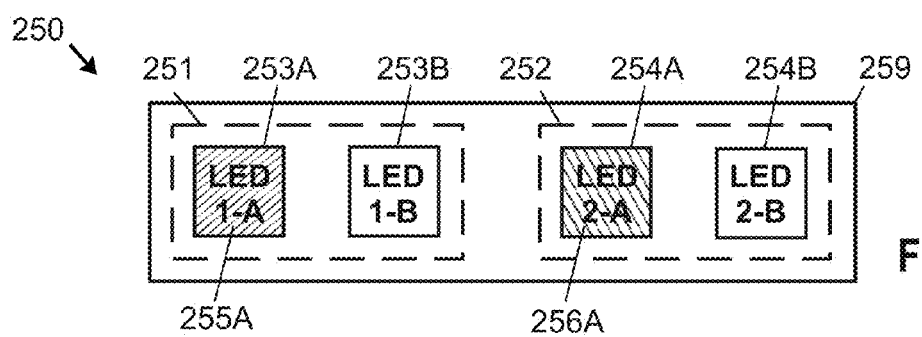
FIG._6F
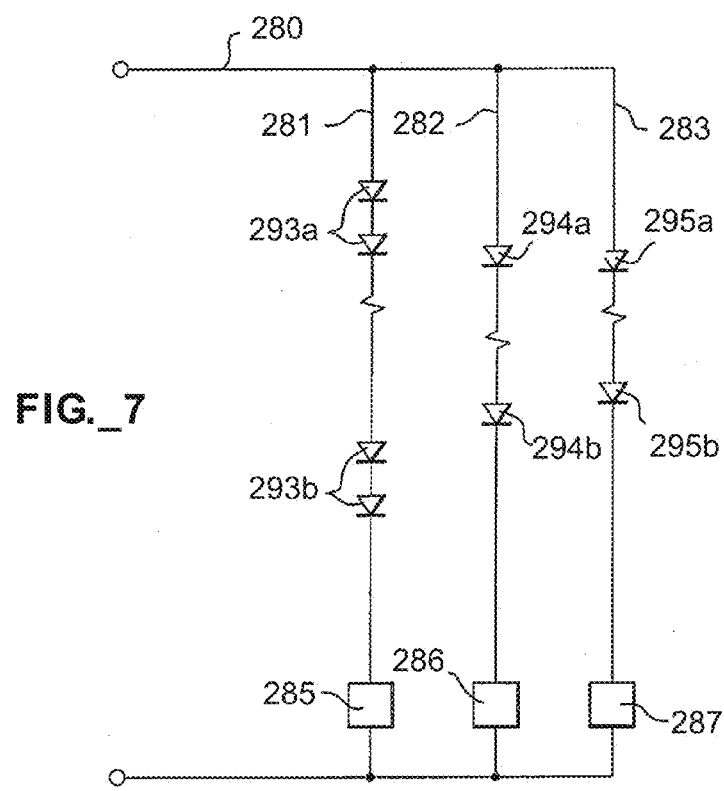
FIG._7

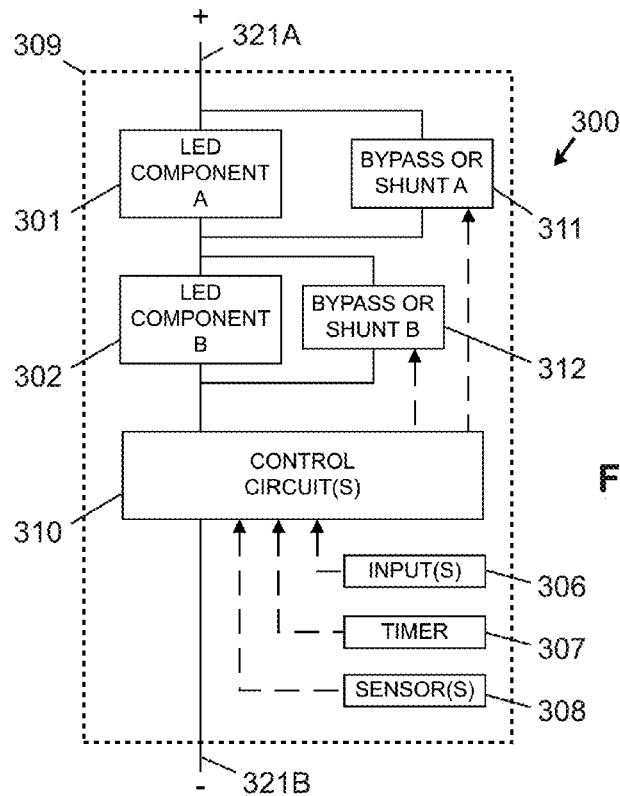
FIG._8
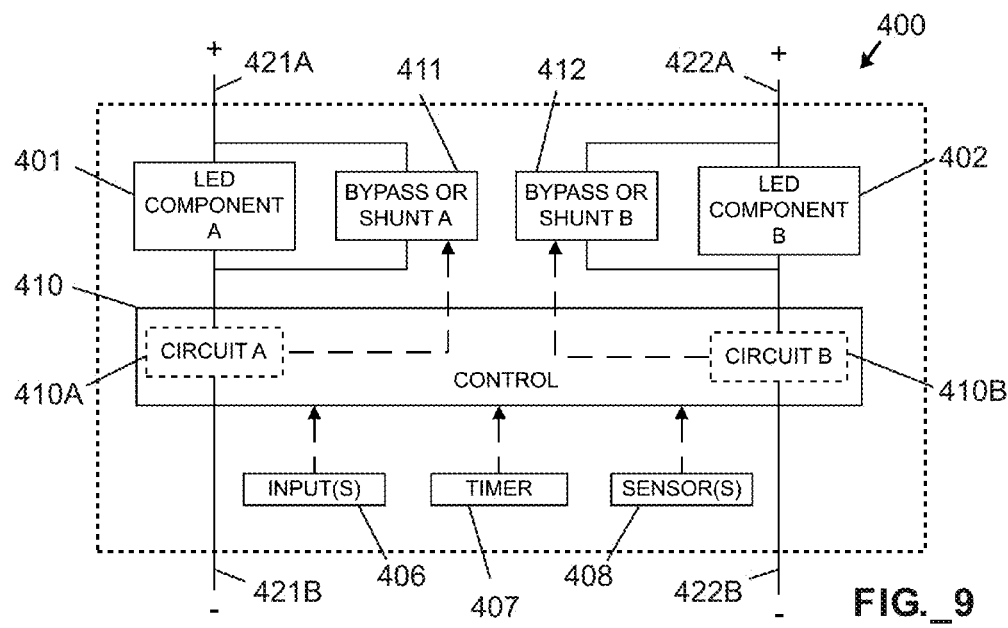
FIG._9

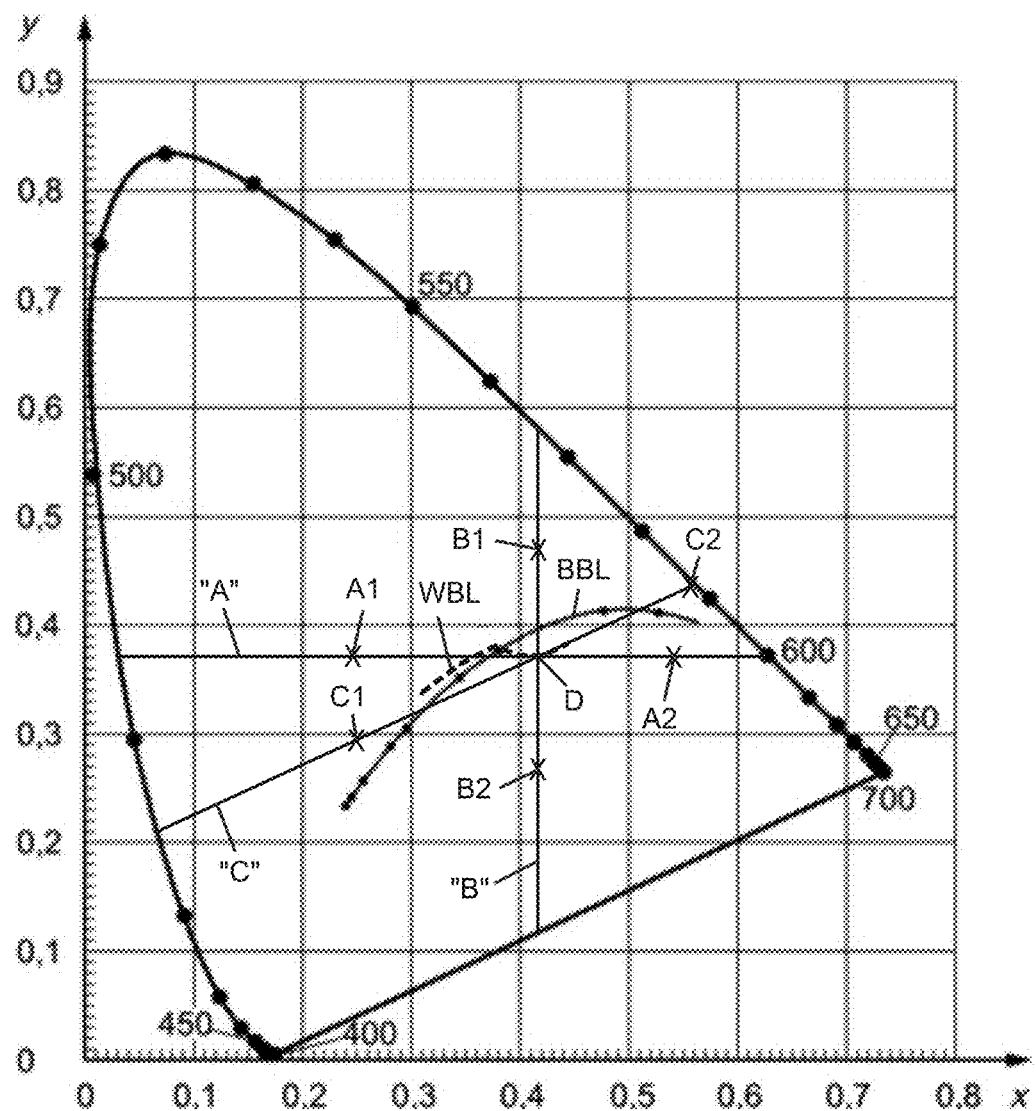
FIG._10

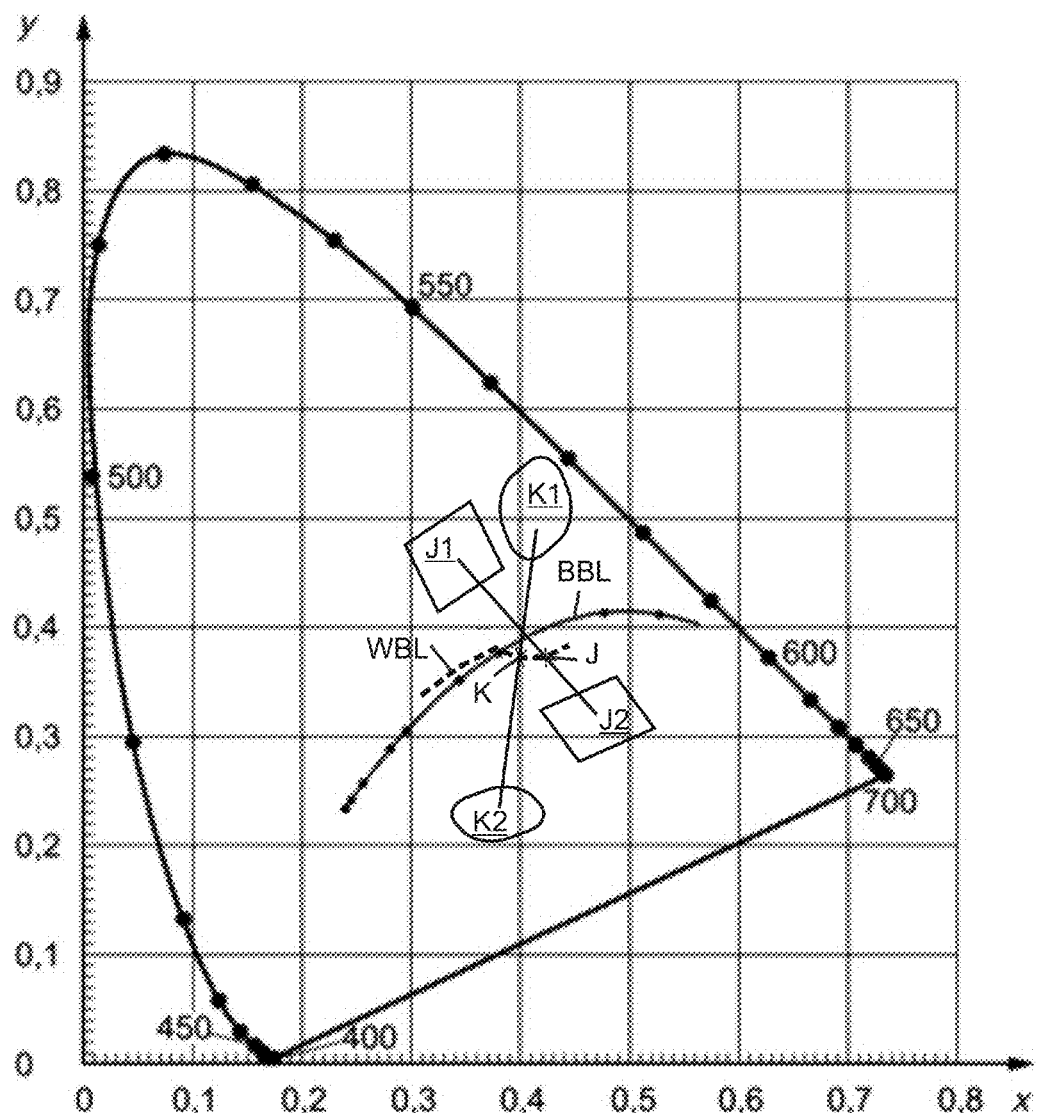
FIG._11

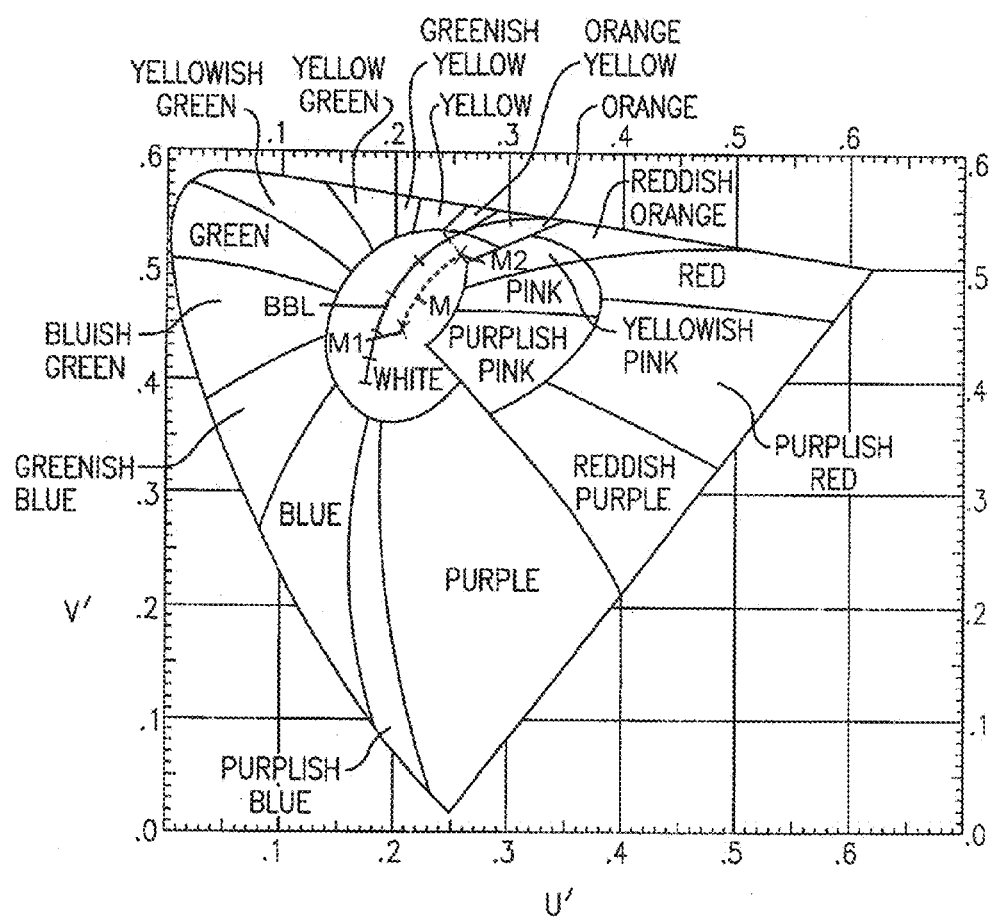
FIG._12

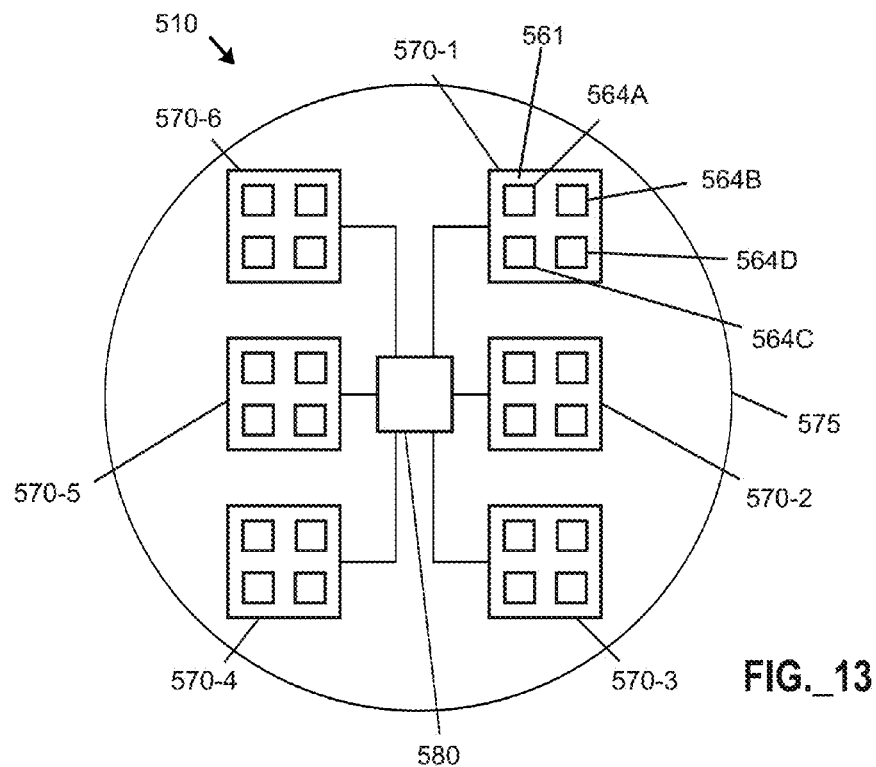
FIG._13
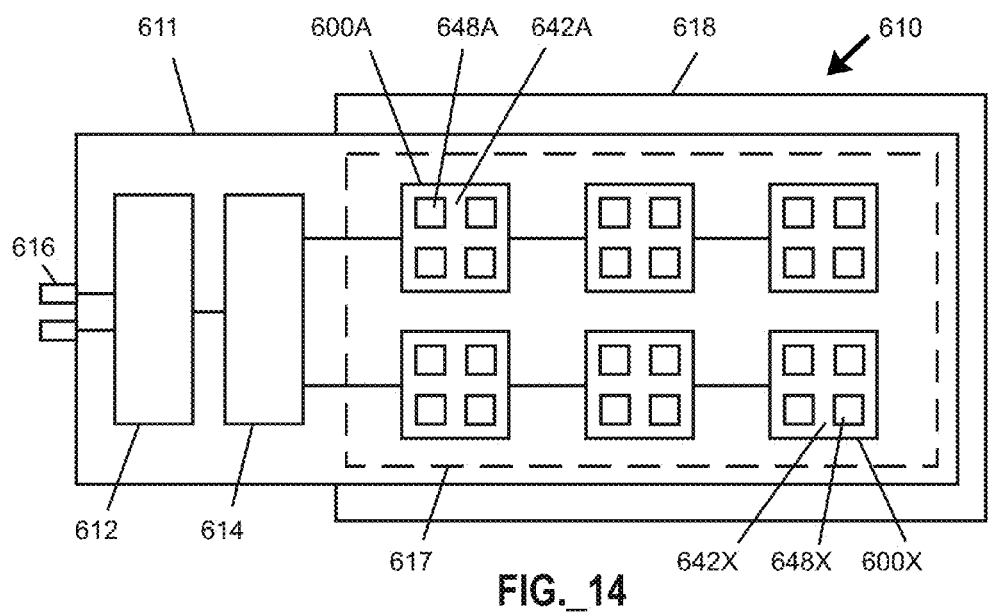
FIG._14

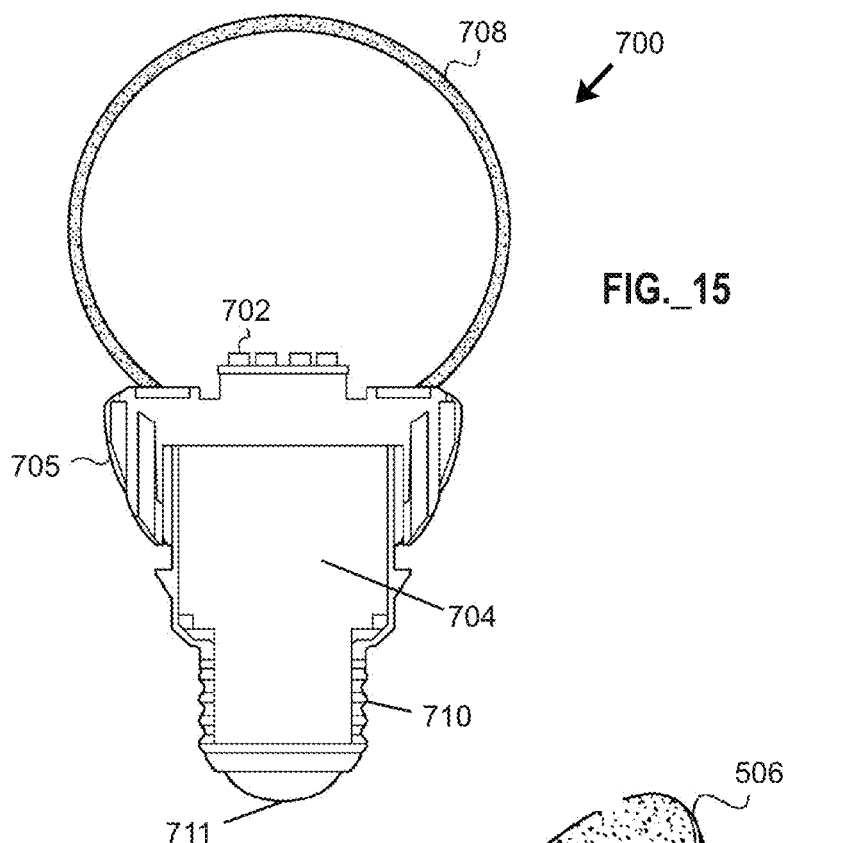
FIG._15
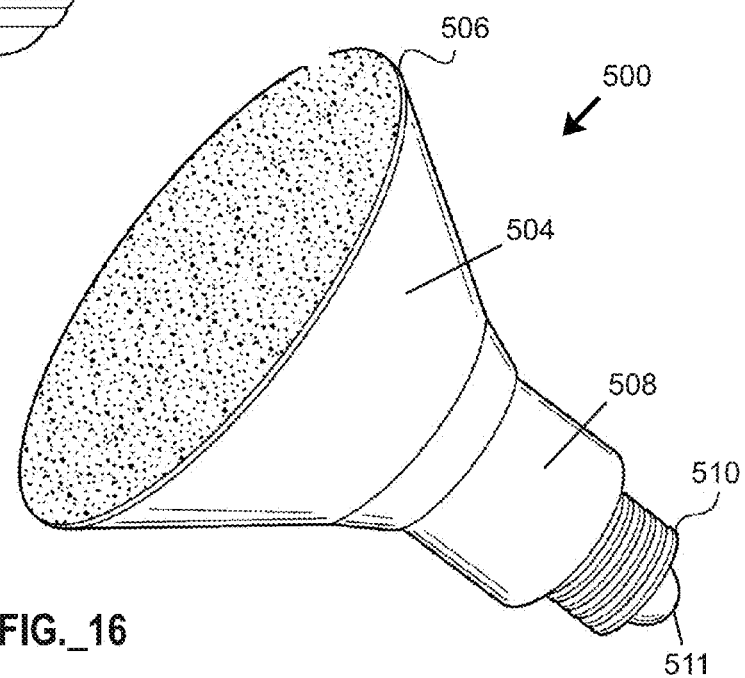
FIG._16

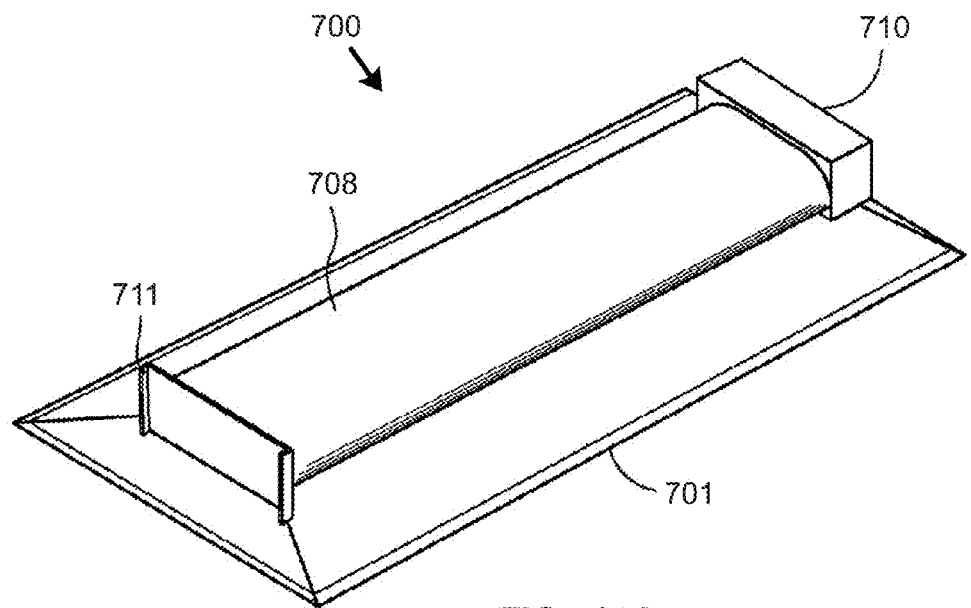
FIG._17A
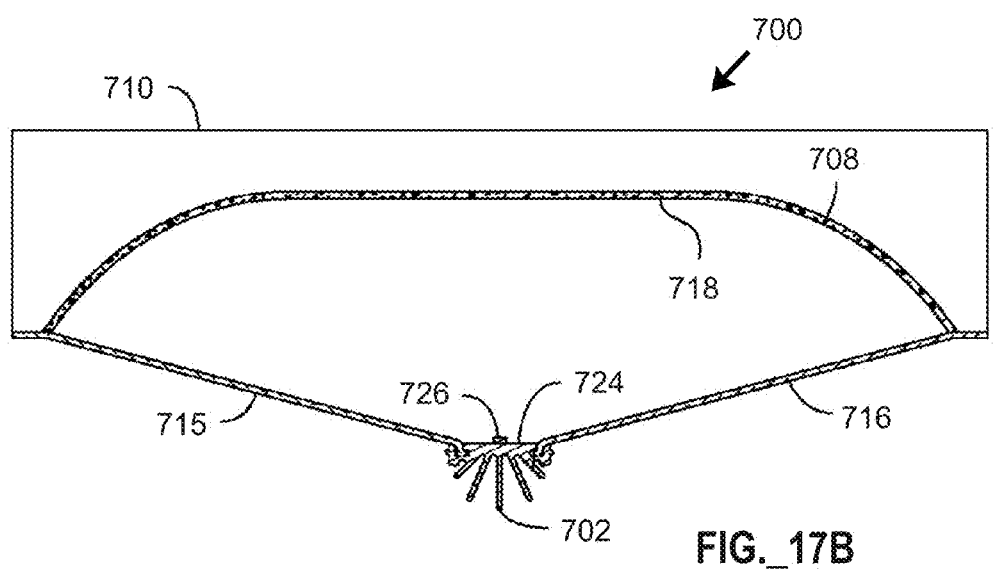
FIG._17B

| | x | y | u' | v' | nm (dom) | Arb. Units | CCT | CRI Ra | R9 | GAI | CQS | S/P ratio | LPW | du'v' BBL/DLL | duv |
|---|---|---|---|---|---|---|---|---|---|---|---|---|---|---|---|
| LED1 Ored 617 dm | 0.6836 | 0.3152 | 0.5050 | 0.5238 | 616.9 | 1.2882 | | | | | | | | | |
| Phosphor NYAG7 | 0.4199 | 0.5506 | 0.1986 | 0.5865 | 568.9 | 1.0271 | | | | | | | | | |
| LED2 XPH 455 dm | 0.1531 | 0.0246 | 0.2048 | 0.0741 | 454.5 | 0.4792 | | | | | | | | | |
| Combined | 0.4211 | 0.3713 | 0.2547 | 0.5053 | 588 | | 2899 | 91 | 83 | 83 | 84 | 1.24 | 98.2 | 0.0017 | -0.011 |

FIG._18A

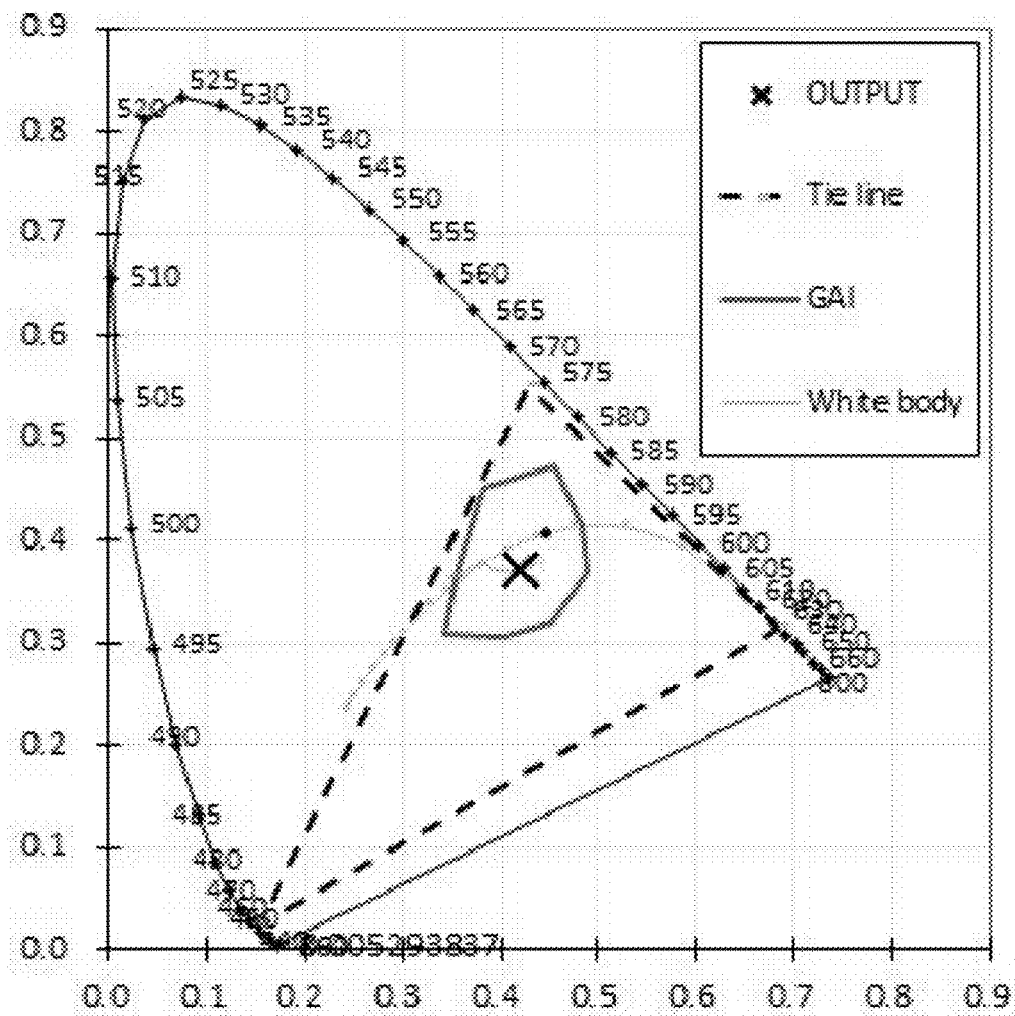
FIG._18B

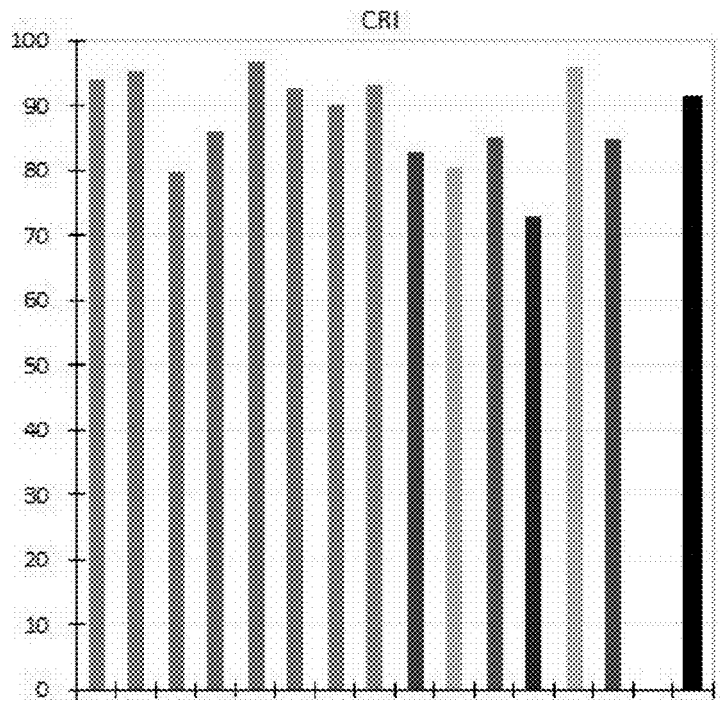
FIG._18C
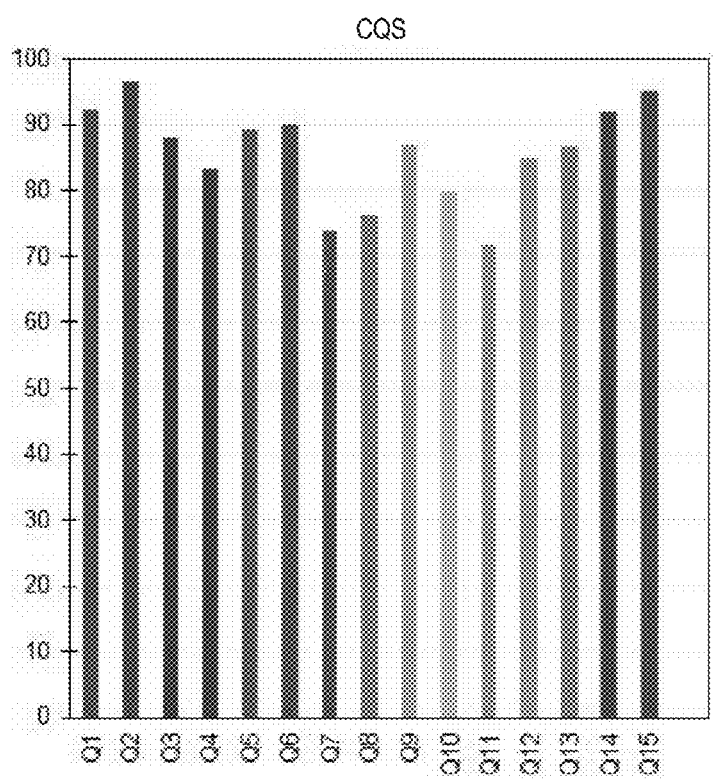
FIG._18D

SOLID STATE LIGHTING DEVICES WITH ADJUSTABLE COLOR POINT

TECHNICAL FIELD

Subject matter herein relates to solid state lighting devices, including devices with lumiphors arranged to be stimulated by electrically activated solid light emitters, and relates to associated methods of making and using such devices.

BACKGROUND

Solid state emitters such as LEDs or lasers may be used to provide white light (e.g., perceived as being white or near-white), and have been investigated as potential replacements for white incandescent lamps. Solid state emitters may include lumiphoric materials (also known as lumiphors) that absorb a portion of emissions having a first peak wavelength emitted by the emitter and re-emit light having a second peak wavelength that differs from the first peak wavelength. Phosphors, scintillators, and lumiphoric inks are common lumiphoric materials. Light perceived as white or near-white may be generated by a combination of red, green, and blue ("ROB") emitters, or, alternatively, by combined emissions of a blue light emitting diode ("LED") and a lumiphor such as a yellow phosphor (e.g., YAG:Ce or Ce:YAG). In the latter case, a portion of the blue LED emissions pass through the phosphor, while another portion of the blue emissions is down-converted to yellow, and the blue and yellow light in combination are perceived as white. White light may also be produced by stimulating phosphors or dyes of multiple colors with a violet or UV LED source.

It is known to enclose an LED chip in a package to provide environmental and/or mechanical protection, color selection, light focusing and other functions. A LED package also includes electrical leads, contacts, and/or traces for electrically connecting the LED package to an external circuit. A conventional LED package 20 is illustrated in FIG. 1, including one or more LED chips 22 mounted over a carrier such as a printed circuit board (PCB) carrier, substrate or submount 23, which may include ceramic material. The package 20 may include one or more LED chips 22 of any suitable spectral output (e.g., ultraviolet, blue, green, red, white (e.g., blue LED chip arranged to stimulate emissions of phosphor material) and/or other colors). A reflector 24 may be mounted on the submount 23 (e.g., with solder or epoxy) to surround the LED chip(s) 22, reflect light emitted by the LED chips 22 away from the package 20, and also provide mechanical protection to the LED chips 22. One or more wirebond connections 21 may be made between ohmic contacts on the LED chips 22 and electrical traces 25A, 25B on the submount 23. The LED chips 22 are covered with a transparent encapsulant 26, which may provide environmental and mechanical protection to the chips while also acting as a lens.

Emissions of a blue LED in combination with a yellow or green lumiphoric material may be near-white in character and referred to as "blue-shifted yellow" ("BSY") light or "blue-shifted green" ("BSG") light. Addition of red spectral output from a red-emitting LED (to yield a "BSY+R" device) or from a red lumiphoric material (to yield a "BS(Y+R)" device) may be used to increase the warmth of the aggregated light output and better approximate light produced by incandescent lamps.

Quality artificial lighting generally attempts to emulate the characteristics of natural light. Natural light sources include daylight with a relatively high color temperature (e.g., ~5000K) and incandescent lamps with a lower color temperature (e.g., ~2800K).

Color reproduction is commonly measured using Color Rendering Index (CRI) or average Color Rendering Index (CRI Ra). To calculate CRI, the color appearance of 14 reflective samples is simulated when illuminated by a reference radiator (illuminant) and the test source. The general or average color rendering index CRI Ra is a modified average utilizing the first eight indices, all of which have low to moderate chromatic saturation. (R9 is one of six saturated test colors not used in calculating CRI, with R9 embodying a large red content.) CRI and CRI Ra are used to determine how closely an artificial light source matches the color rendering of a natural light source at the same correlated color temperature. Daylight has a high CRI Ra (approximately 100), with incandescent bulbs also being relatively close (CRI Ra greater than 95), and fluorescent lighting being less accurate (with typical CRI Ra values of approximately 70-80).

CRI Ra (or CRI) alone is not a satisfactory measure of the benefit of a light source, since it confers little ability to predict color discrimination (i.e., to perceive subtle difference in hue) or color preference. There appears to be a natural human attraction to brighter color. Daylight provides a spectrum of light that allows the human eye to perceive bright and vivid colors, which allows objects to be distinguished even with subtle color shade differences. Accordingly, it is generally recognized that daylight is the "best" light for emphasizing and distinguishing color. The ability of human vision to differentiate color is different under correlated color temperature conditions providing the same CRI Ra. Such differentiation is proportional to the gamut of the illuminating light.

Gamut area of a light source can be calculated as the area enclosed within a polygon defined by the chromaticities in CIE 1976 u'v' color space of the eight color chips used to calculate CRI Ra when illuminated by a test light source. Gamut area index (GAI) is a convenient way of characterizing in chromaticity space how saturated the illumination makes objects appear—with a larger GAI making object colors appear more saturated. GAI is a relative number whereby an imaginary equal-energy spectrum (wherein radiant power is equal at all wavelengths) is scored as 100. GAI for a test source is determined by comparing color space area of the light being tested to the color space area produced by the imaginary or theoretical equal-energy spectrum (EES) source. Unlike CRI Ra (or CRI), which has a maximum value of 100, GAI can exceed 100, meaning that some sources saturate colors more than an equal-energy source serves to saturate color.

It is found that typical blackbody-like light sources and typical daylight-like light sources have different gamut areas. Low correlated color temperature (CCT) sources (e.g., incandescent emitters) have a gamut area index of approximately 50% (i.e., about half the gamut area of the EES source). Sources with higher CCT values have a larger GAI. For example, a very bluish light with a CCT of 10000K may have a GAI of 140%.

The reference spectra used in color rendering index calculations were chosen as ideal illumination sources defined in terms of their color temperature. As a heated object becomes incandescent, it first glows reddish, then yellowish, then white, and finally bluish. Thus, apparent colors of incandescing materials are directly related to their actual temperature (in Kelvin (K)). Practical materials that incandesce are said to have correlated color temperature (CCT) values that are directly related to color temperatures of blackbody sources. CCT is intended to characterize the apparent "tint" of the illumination (e.g., warm or cool) produced by an electric light source. Certain implicit assumptions are embedded in this CCT designation—such as the assumption that chromaticities along the line of blackbody radiation (also known as the blackbody locus or the Planckian locus) are perceived as 'white', and that a CCT designation for a manufactured light source implies consistency in chromaticities of all sources having that designation. Recent research suggests, however, that most sources with chromaticities along the line of blackbody radiation do not appear "white"; rather, such sources provide illumination with discernible tint. An empirically established line of minimum tint in CIE 1931 (x,y) chromaticity space for CCTs between 2700K and 6500K is shown in FIG. 2 Researchers have determined that a majority of people prefer sources of illumination on this "white body line" or "white body locus" (i.e., line of minimum tint) more than those of the same CCT line of blackbody radiation. (See, e.g., Rea, M. S. and Freyssinier, J. P.: White lighting for residential applications, Light Res. Tech., 45(3), pp. 331-344 (2013).) As shown in FIG. 2, at CCT values below about 4000K, the "white body line" (WBL) is below the blackbody curve, whereas at higher CCT values, the WBL is above the blackbody curve.

Rea and Freyssinier have proposed that lighting could be generally improved by ensuring that its CRI Ra value is at least 80 while its GAI is in a range of from 80 to 100 (i.e., 80% and 100% of an equal energy spectrum). FIG. 3 provides a plot of GAI values along the y-axis and CRI Ra values along the x-axis, with the shaded region at upper right representing a preferred combination of CRI Ra≥80 and 80≤GAI≤100. Rea and Freyssinier have proposed to designate a light source embodying CRI Ra and GAI values in the foregoing ranges as a "Class A" light source.

Characteristics including CCT, CRI Ra, GAI, CIE 1931 (x,y) coordinates, luminous efficacy (lm/W), and scotopic/photopic (S/P) ratios for eighteen different light sources are tabulated in FIG. 4A, and chromaticities for selected sources of the foregoing eighteen light sources are plotted in FIG. 4B together with the blackbody curve (also known as the Planckian locus) and the WBL (line of minimum tint). (Source: "Value Metrics for Better Lighting," Rea, Mark S., et al., 2013, pp. 54 & 63, SPIE Press (Bellingham, Wash., US), ISBN 978-0-8194-9322-4.) Only three sources (i.e., Xenon lamp (#1.5), fluorescent F40T12 daylight lamp (#2.7), and ceramic metal halide (#2.8)) meet the Class A color designation. Although numerous solid state light sources are characterized in FIG. 4A (i.e., white LED 6500K (#1.6 and #2.10), white LED 2700K (#2.9), and blue LED 470 nm peak (#3.1)), none of these solid state light sources meet the Class A color designation.

As indicated in FIG. 4A, the ability of artificial lights to accurately illuminate color objects varies enormously by type. Solid state emitters such as LEDs in combination with lumiphors create white light by mixing relatively narrow wavelength bands together with spectral gaps between peaks of LEDs and/or lumiphors. The resulting light may be undersaturated with certain colors of the spectrum or oversaturated with certain colors. One way to alleviate oversaturation with respect to certain portions of the visible spectrum and thereby improve CRI includes notch filtering of LED lighting systems with an optical element (e.g., incorporating a rare earth compound such as neodymium oxide, or a color pigment) that filters light emissions so that light passing through or reflected by the optical element exhibits a spectral notch, as disclosed in U.S. Patent Application Publication No. 2013/0170199 A2 entitled "LED lighting using spectral notching" (which is hereby incorporated by reference herein). Such publication discloses that CRI and GAI values of LED light sources can be improved through use of notch filtering, such as to increase CRI from 84 to 90, and to increase GAI from 50 to 58. Alternatively, careful selection of materials used in LED lighting devices may permit attainment of CRI Ra values of 90 to 95 or more—see, e.g., U.S. Pat. No. 7,213,940, which is hereby incorporated by reference.

Although it is well known to use combinations of RGB (red-green-blue) LEDs to enable color point to be adjusted along any suitable trajectory, the resulting emissions typically have relatively low CRI Ra values and limited efficacy (lumens/watt).

The art continues to seek improved solid state lighting devices providing desirable illumination characteristics, as well as improved methods for making and using solid state devices.

SUMMARY

The present disclosure relates in various aspects to solid state (e.g., LED) lighting devices including multiple solid state light emitters and a control circuit configured to adjust aggregated emissions of the lighting device to produce a mixture of light having an adjustable color point together with high luminous efficacy, wherein at least one color point is on or near (e.g., within 7 MacAdam ellipses of, or alternatively within 5 MacAdam ellipses of) the WBL or line of minimum tint. In certain aspects, a lighting device including multiple solid state light emitters and a control circuit may include an adjustable color point to provide constant or nearly constant x-values of 1931 CIE coordinates; constant or nearly-constant y-values of 1931 CIE coordinates; or constant or nearly constant distance relative to the blackbody locus (e.g., together with variation in CCT of at least 100K for the two color points). In certain aspects, a lighting device including multiple solid state light emitters and a control circuit may include an adjustable color point between one point on or near the Planckian (blackbody) locus and another point on or near the WBL with relatively constant CCT (e.g., CCT variation of 100K or less). In certain aspects, a lighting device including multiple solid state light emitters and a control circuit may include an adjustable color point to provide a first color point on or near the WBL and a second color point having significantly different CCT and luminous flux. In certain aspects, a lighting device including first and second solid state light emitters and a control circuit may include an adjustable color point including one point on or near the WBL, wherein the first emitter is arranged to produce light emissions in a first bin defining a first continuous region occupying a first area not exceeding 10% (optionally not exceeding 8%, 6%, 5%, 4%, 3%, or 2%) of a 1931 CIE Chromaticity diagram and the second emitter is arranged to produce light emissions in a second bin defining a second continuous region occupying a second area not exceeding 10% (optionally not exceeding 8%, 6%, 5%, 4%, 3%, or 2%) of a 1931 CIE Chromaticity diagram, and the device is devoid of solid state emitters outside the first bin or the second bin. In certain aspects, a solid state lighting device includes a first solid state emitter arranged to produce light emissions in a first bin defining a first continuous region occupying a first area not exceeding 10% (optionally not exceeding 8%, 6%, 5%, 4%, 3%, or 2%) of a 1931 CIE Chromaticity diagram and a second solid state emitter arranged to produce light emissions in a second bin defining a second continuous region occupying a second area not exceeding 10% (optionally not exceeding 8%, 6%, 5%, 4%, 3%, or 2%) of a 1931 CIE Chromaticity diagram and non-overlapping with the first region, a combination of light produces a color point on or near the WBL, and the device is devoid of solid state emitters outside the first bin or the second bin. The resulting color point for the combination of light may be non-adjustable.

In one aspect, a lighting device includes a first electrically activated solid state emitter; a second electrically activated solid state emitter; and a control circuit configured to adjust aggregated light emissions of the solid state lighting device to move between at least two color points; wherein at least a first color point of the at least two color points embodies a combination of light exiting the lighting device that was emitted by the first electrically activated solid state emitter and the second electrically activated solid state emitter that produces, in the absence of any additional light, aggregated light emissions (i) having a luminous efficacy of at least 60 lumens per watt, and (ii) having (x, y) coordinates on a 1931 CIE Chromaticity Diagram that define a point on or within 7 MacAdam ellipses (or within 5 MacAdam ellipses) of a white body locus embodying a line including segments defined by the following x, y coordinates on a 1931 CIE Chromaticity Diagram: (0.3114, 0.3386) to (0.3462, 0.3631), (0.3462, 0.3631) to (0.3777, 0.3790), (0.3777, 0.3790) to (0.3977, 0.3707), (0.3977, 0.3707) to (0.4211, 0.3713), and (0.4211, 0.3713) to (0.4437, 0.3808).

In another aspect, a lighting device includes a first electrically activated solid state emitter; a second electrically activated solid state emitter; and a control circuit configured to adjust aggregated light emissions of the solid state lighting device to move between at least two color points; wherein at least a first color point of the at least two color points embodies a combination of light exiting the lighting device that was emitted by the first and the second electrically activated solid state emitter that produces, in the absence of any additional light, aggregated light emissions having (x, y) coordinates on a 1931 CIE Chromaticity Diagram that define a point on or within 7 MacAdam ellipses (or within 5 MacAdam ellipses) of a white body locus embodying a line including segments defined by the following x, y coordinates on a 1931 CIE Chromaticity Diagram: (0.3114, 0.3386) to (0.3462, 0.3631), (0.3462, 0.3631) to (0.3777, 0.3790), (0.3777, 0.3790) to (0.3977, 0.3707), (0.3977, 0.3707) to (0.4211, 0.3713), and (0.4211, 0.3713) to (0.4437, 0.3808); and wherein the at least two color points are related according to one of the following conditions (a) to (c): the at least two color points comprise a variation in x coordinate value of (x, y) coordinates on a 1931 CIE Chromaticity Diagram of less than 0.001; the at least two color points comprise a variation in y coordinate value of (x, y) coordinates on a 1931 CIE Chromaticity Diagram of less than 0.001; and the at least two color points, when plotted on a CIE 1976 u'-v' chromaticity diagram, differ in Delta u'v' values relative to one another by an amount of no greater than 0.01, and differ in correlated color temperature (CCT) values by an amount of at least 100K relative to one another.

In another aspect, the present disclosure relates to a lighting device including a first electrically activated solid state emitter; a second electrically activated solid state emitter; and a control system configured to adjust aggregated light emissions of the solid state lighting device to move between at least two color points; wherein at least a first color point of the at least two color points embodies a combination of light exiting the lighting device that was emitted by the first electrically activated solid state emitter and the second electrically activated solid state emitter that produces, in the absence of any additional light, aggregated light emissions having (x, y) coordinates on a 1931 CIE Chromaticity Diagram that define a point on or within 7 MacAdam ellipses (or within 5 MacAdam ellipses) of a white body locus embodying a line including segments defined by the following x, y coordinates on a 1931 CIE Chromaticity Diagram: (0.3114, 0.3386) to (0.3462, 0.3631), (0.3462, 0.3631) to (0.3777, 0.3790), (0.3777, 0.3790) to (0.3977, 0.3707), (0.3977, 0.3707) to (0.4211, 0.3713), and (0.4211, 0.3713) to (0.4437, 0.3808); wherein at least a second color point of the at least two color points embodies a combination of light exiting the lighting device that was emitted by the first electrically activated solid state emitter and the second electrically activated solid state emitter that produces, in the absence of any additional light, aggregated light emissions having (x, y) coordinates on a 1931 CIE Chromaticity Diagram that define a point on or within 10 MacAdam ellipses of a Planckian locus; and wherein the at least a first color point and the at least a second color point differ in correlated color temperature (CCT) by a value of less than or equal to 100K relative to one another.

In another aspect, the present disclosure relates to a lighting device including a first electrically activated solid state emitter; a second electrically activated solid state emitter; and a control system configured to adjust aggregated light emissions of the solid state lighting device to move between at least two color points; wherein at least a first color point of the at least two color points embodies a combination of light exiting the lighting device that was emitted by the first electrically activated solid state emitter and the second electrically activated solid state emitter that produces, in the absence of any additional light, aggregated light emissions having a first correlated color temperature (CCT) value and having (x, y) coordinates on a 1931 CIE Chromaticity Diagram that define a point on or within 7 MacAdam ellipses (or within 5 MacAdam ellipses) of a white body locus embodying a line including segments defined by the following x, y coordinates on a 1931 CIE Chromaticity Diagram: (0.3114, 0.3386) to (0.3462, 0.3631), (0.3462, 0.3631) to (0.3777, 0.3790), (0.3777, 0.3790) to (0.3977, 0.3707), (0.3977, 0.3707) to (0.4211, 0.3713), and (0.4211, 0.3713) to (0.4437, 0.3808); and wherein at least a second color point of the at least two color points embodies a combination of light exiting the lighting device that was emitted by the first electrically activated solid state emitter and the second electrically activated solid state emitter that produces, in the absence of any additional light, aggregated light emissions having a second correlated color temperature (CCT) value; wherein the first CCT value and the second CCT value differ by at least 500K; and wherein aggregated light emissions at the first color point and aggregated light emissions at the second color point differ in luminous flux by at least 30%.

In another aspect, the present disclosure relates to a solid state lighting device including at least one first electrically activated solid state light emitter arranged to produce, in the absence of any additional light, light emissions within a first bin defining a first continuous region occupying an area not exceeding 10% (optionally not exceeding 8%, 6%, 5%, 4%, 3%, or 2%) of a 1931 CIE Chromaticity Diagram; at least one second electrically activated solid state light emitter arranged to produce, in the absence of any additional light, light emissions within a second bin defining a second continuous region occupying an area not exceeding 10% (optionally not exceeding 8%, 6%, 5%, 4%, 3%, or 2%) of a 1931 CIE Chromaticity Diagram, wherein the second continuous region is non-overlapping with the first continuous region, and the at least one first electrically activated solid state light emitter is independently controllable relative to the at least one second electrically activated solid state light emitter; a control circuit configured to adjust aggregated light emissions of the solid state lighting device to move between at least two color points; wherein at least a first color point of the at least two color points embodies a combination of light exiting the lighting device that was emitted by the first electrically activated solid state emitter and the second electrically activated solid state emitter that produces, in the absence of any additional light, aggregated light emissions having (x, y) coordinates on a 1931 CIE Chromaticity Diagram that define a point on or within 7 MacAdam ellipses (or within 5 MacAdam ellipses) of a white body locus embodying a line including segments defined by the following x, y coordinates on a 1931 CIE Chromaticity Diagram: (0.3114, 0.3386) to (0.3462, 0.3631), (0.3462, 0.3631) to (0.3777, 0.3790), (0.3777, 0.3790) to (0.3977, 0.3707), (0.3977, 0.3707) to (0.4211, 0.3713), and (0.4211, 0.3713) to (0.4437, 0.3808); and wherein the solid state lighting device is devoid of any electrically activated solid state light emitter arranged to produce, in the absence of any additional light, light emissions outside either the first bin or the second bin.

In another aspect, the present disclosure relates to a solid state lighting device including: at least one first electrically activated solid state light emitter arranged to produce, in the absence of any additional light, light emissions within a first bin defining a first continuous region occupying an area not exceeding 10% (optionally not exceeding 8%, 6%, 5%, 4%, 3%, or 2%) of a 1931 CIE Chromaticity Diagram; at least one second electrically activated solid state light emitter arranged to produce, in the absence of any additional light, light emissions within a second bin defining a second continuous region occupying an area not exceeding 10% (optionally not exceeding 8%, 6%, 5%, 4%, 3%, or 2%) of a 1931 CIE Chromaticity Diagram; and a first power line, wherein each of the at least one first and the at least one second solid state light emitter is electrically connected to the first power line; wherein the second continuous region is non-overlapping with the first continuous region, and the at least one first electrically activated solid state light emitter is independently controllable relative to the at least one second electrically activated solid state light emitter; wherein a combination of light exiting the lighting device that was emitted by the first electrically activated solid state emitter and the second electrically activated solid state emitter produces, in the absence of any additional light, aggregated light emissions having (x, y) coordinates on a 1931 CIE Chromaticity Diagram that define a color point on or within 7 MacAdam ellipses (or within 5 MacAdam ellipses) of a white body locus embodying a line including segments defined by the following x, y coordinates on a 1931 CIE Chromaticity Diagram: (0.3114, 0.3386) to (0.3462, 0.3631), (0.3462, 0.3631) to (0.3777, 0.3790), (0.3777, 0.3790) to (0.3977, 0.3707), (0.3977, 0.3707) to (0.4211, 0.3713), and (0.4211, 0.3713) to (0.4437, 0.3808); and wherein the solid state lighting device is devoid of any electrically activated solid state light emitter arranged to produce, in the absence of any additional light, light emissions outside either the first bin or the second bin.

In another aspect, the present disclosure relates to a method comprising illuminating an object, a space, or an environment, utilizing a solid state lighting device as described herein.

In another aspect, any of the foregoing aspects, and/or various separate aspects and features as described herein, may be combined for additional advantage. Any of the various features and elements as disclosed herein may be combined with one or more other disclosed features and elements unless indicated to the contrary herein.

Other aspects, features and embodiments of the present disclosure will be more fully apparent from the ensuing disclosure and appended claims.

BRIEF DESCRIPTION OF THE DRAWINGS

FIG. 1 is a side cross-sectional view of a first conventional light emitting diode package.

FIG. 2 is an excerpt of a CIE 1931 chromaticity diagram showing the blackbody locus and including a line of minimum tint (or "white body line") extending between CCT values of from 2700K to 6500K.

FIG. 3 is a two dimensional plot of gamut area index (GAI) and color rendering index (CRI Ra) including a shaded region at upper right representing a preferred combination of CRI Ra≥80 and 80≤GAI≤100.

FIG. 4A is a chart including CCT, CRI Ra, GAI, CIE 1931 (x,y) coordinates, luminous efficacy (lm/W), and scotopic/photopic (S/P) ratios for eighteen different light sources.

FIG. 4B is an excerpt of a CIE 1931 chromaticity diagram showing the blackbody locus, the line of minimum tint (or "white body line") extending between CCT values from 2700K to 6500K, and (x,y) coordinate plots for selected sources of the eighteen light sources listed in FIG. 4A.

FIG. 5A is a top perspective view of a lighting device embodying a solid state emitter package including four LED chips capable of being independently controlled.

FIG. 5B is a bottom plan view of the lighting device of FIG. 5A.

FIG. 6A is a schematic view of a first lighting device including first and second solid state emitters (e.g., including LEDs) arranged on a single submount or substrate.

FIG. 6B is a schematic view of a second lighting device including first and second solid state emitters arranged on a single submount or substrate.

FIG. 6C is a schematic view of a third lighting device including a pair of solid state emitters arranged in a first mounting region and another solid state emitter arranged in a second mounting region, all arranged on a single submount or substrate.

FIG. 6D is a schematic view of a fourth lighting device including a pair of solid state emitters arranged in a first mounting region and another solid state emitter arranged in a second mounting region, all arranged on a single submount or substrate.

FIG. 6E is a schematic view of a fifth lighting device including a first pair of solid state emitters arranged in a first mounting region and another pair of solid state emitters arranged in a second mounting region, all arranged on a single submount or substrate.

FIG. 6F is a schematic view of a sixth lighting device including a first pair of solid state emitters arranged in a first mounting region and another pair of solid state emitters arranged in a second mounting region, all arranged on a single submount or substrate.

FIG. 7 illustrates a portion of a first control circuit arranged to control multiple strings of solid state emitters (e.g., LEDs).

FIG. 8 is a simplified schematic diagram illustrating interconnections between various components of a light emitting apparatus including first and second solid state emitters (e.g., LED components) arranged in series and at least one control circuit.

FIG. 9 is a simplified schematic diagram illustrating interconnections between various components of a light emitting apparatus including first and second solid state emitters (e.g., LED components) arranged in parallel and at least one control circuit.

FIG. 10 is a CIE 1931 chromaticity diagram showing the blackbody locus, overlaid with the line of minimum tint (or "white body line"), and first, second, and third lines that separately intersect the white body line and that each embody potential combinations of color points that may be mixed to yield an aggregate color point on or near the white body line.

FIG. 11 is a CIE 1931 chromaticity diagram showing the blackbody locus, overlaid with the line of minimum tint (or "white body line"), and two corresponding pairs of color point bins.

FIG. 12 illustrates a CIE 1976 (u'v') chromaticity diagram showing the blackbody locus, showing identified regions of different colors or hues, and showing a line "M" embodying color points obtainable with solid state emitters and/or lighting devices disclosed herein, wherein the line of color points embodies a substantially constant distance from corresponding points of the blackbody locus.

FIG. 13 is a simplified plan view of a light emitting apparatus including multiple LED components and at least one control circuit.

FIG. 14 is a simplified plan view of another light emitting apparatus including multiple LED components and at least one control circuit.

FIG. 15 is a side cross-sectional view of a first light bulb arranged to incorporate multiple solid state emitter chips.

FIG. 16 is a side cross-sectional view of a second, reflector-type light bulb arranged to incorporate at least one emitter chip as disclosed herein.

FIG. 17A is an upper perspective view of a troffer-type light fixture arranged to incorporate multiple solid state emitter chips as disclosed herein.

FIG. 17B is a side cross-sectional view of a portion of the light fixture of FIG. 17A.

FIG. 18A is a table including numerical results for modeling of a solid state lighting device including an orange/red (617 nm dominant wavelength) LED, a blue (455 nm dominant wavelength) LED, and a yellow phosphor (NYAG 7), yielding composite emissions with 521 pupil lumens, a CCT of 2999K, a CRI Ra value of 91, and a GAI value of 83%.

FIG. 18B is a CIE 1931 chromaticity diagram showing the blackbody locus, a portion of the line of minimum tint (or white body line), and the following items for the LEDs and phosphor of FIG. 18A: tie lines, gamut area, and composite color point (output).

FIG. 18C is a bar chart providing CRI values for individual color chips and CRI Ra (in the rightmost bar) obtained by modeling of a combination of light emitted by the LEDs and phosphor of FIG. 18A.

FIG. 18D is a bar chart providing CQS values for individual color chips obtained by modeling of a combination of light emitted by the LEDs and phosphor of FIG. 18A.

DETAILED DESCRIPTION

As noted previously, the art continues to seek solid state lighting devices providing desirable illumination characteristics. Various embodiments disclosed herein include solid state (e.g., LED) lighting devices including multiple solid state light emitters arranged to produce a mixture of light having a color rendering index (CRI Ra) value of at least 80, having a gamut area index (GAI) value in a range of from 80 to 100, and x, y coordinates within a predefined region of a 1931 CIE Chromaticity diagram, e.g., including x, y coordinates defining point on or within a first polygon bounded by the following x, y coordinates: (0.38, 0.34), (0.38, 0.36), (0.40, 0.38), (0.42, 0.38), (0.44, 0.36), (0.46, 0.36), and (0.46, 0.34), or within a second polygon bounded by the following x, y coordinates: (0.38, 0.34), (0.38, 0.36), (0.40, 0.36), and (0.40, 0.36), wherein in the case of the second polygon the CRI Ra value may be in a range of at least 90. Each of the foregoing polygons is below the blackbody locus and includes CCT values below 4000K. The foregoing devices simultaneously provide enhanced vividness and sufficiently high CRI Ra to be used for general illumination. In certain embodiments, the plurality of solid state light emitters may include a primary solid state light emitter arranged to generate emissions comprising a dominant wavelength in a range of from 430 nm to 480 nm, and at least one supplemental solid state light emitter arranged to generate supplemental solid state light emitter emissions comprising a dominant wavelength in a range of from 590 nm to 650 nm; wherein at least one lumiphor is arranged to receive and be excited by at least a portion of emissions of the at least one primary solid state light emitter and responsively emit lumiphor emissions comprising a dominant wavelength in a range of from about 535 nm to about 585 nm (or in a range of from 545 nm to 585 nm in certain embodiments).

Unless otherwise defined, terms used herein should be construed to have the same meaning as commonly understood by one of ordinary skill in the art to which the present disclosure belongs. It will be further understood that terms used herein should be interpreted as having a meaning that is consistent with their meaning in the context of this specification and the relevant art, and should not be interpreted in an idealized or overly formal sense unless expressly so defined herein.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

Embodiments of the present disclosure are described herein with reference to cross-sectional, perspective, elevation, and/or plan view illustrations that are schematic illustrations of idealized embodiments of the present disclosure. Variations from the shapes of the illustrations as a result, for example, of manufacturing techniques and/or tolerances, are to be expected, such that embodiments of the present disclosure should not be construed as limited to particular shapes illustrated herein. The present disclosure may be embodied in different forms and should not be construed as limited to the specific embodiments set forth herein. In the drawings, the size and relative sizes of layers and regions may be exaggerated for clarity. In certain drawings, conventional features inherent to LED devices known in the art but not essential to the understanding of the present disclosure have been omitted to facilitate ease of explanation of the inventive subject matter.

Unless the absence of one or more elements is specifically recited, the terms "comprising," "including," and "having" as used herein should be interpreted as open-ended terms that do not preclude the presence of one or more elements.

It will be understood that when an element such as a layer, region, or substrate is referred to as being "on" another element, it can be directly on the other element or intervening elements may be present. Moreover, relative terms such as "on", "above", "upper", "top", "lower", or "bottom" may be used herein to describe a relationship between one structure or portion to another structure or portion as illustrated in the figures, but it should be understood that such relative terms are intended to encompass different orientations of the device in addition to the orientation depicted in the figures. For example, if a device in the figures is turned over, a structure or portion described as "above" other structures or portions would now be oriented "below" the other structures or portions.

The terms "solid state light emitter" or "solid state emitter" (which may be qualified as being "electrically activated") may include a light emitting diode, laser diode, organic light emitting diode, and/or other semiconductor device which includes one or more semiconductor layers, which may include silicon, silicon carbide, gallium nitride and/or other semiconductor materials, a substrate which may include sapphire, silicon, silicon carbide and/or other microelectronic substrates, and one or more contact layers which may include metal and/or other conductive materials.

Solid state light emitting devices according to embodiments of the present disclosure may include, but are not limited to, III-V nitride based LED chips or laser chips fabricated on a silicon, silicon carbide, sapphire, or III-V nitride growth substrate, including (for example) devices manufactured and sold by Cree, Inc. of Durham, N.C. Such LEDs and/or lasers may optionally be configured to operate such that light emission occurs through the substrate in a so-called "flip chip" orientation. Such LED and/or laser chips may also be devoid of growth substrates (e.g., following growth substrate removal).

LED chips useable with lighting devices as disclosed herein may include horizontal devices (with both electrical contacts on a same side of the LED) and/or vertical devices (with electrical contacts on opposite sides of the LED). A horizontal device (with or without the growth substrate), for example, may be flip chip bonded (e.g., using solder) to a carrier substrate or printed circuit board (PCB), or wire bonded. A vertical device (without or without the growth substrate) may have a first terminal solder bonded to a carrier substrate, mounting pad, or printed circuit board (PCB), and have a second terminal wire bonded to the carrier substrate, electrical element, or PCB. Although certain embodiments shown in the figures may be appropriate for use with vertical LEDs, it is to be appreciated that the present disclosure is not so limited, such that any combination of one or more of the following LED configurations may be used in a single solid state light emitting device: horizontal LED chips, horizontal flip LED chips, vertical LED chips, vertical flip LED chips, and/or combinations thereof, with conventional or reverse polarity. Examples of vertical and horizontal LED chip structures are discussed by way of example in U.S. Publication No. 2008/0258130 to Bergmann et al. and in U.S. Pat. No. 7,791,061 to Edmond et al. which are hereby incorporated by reference herein.

Solid state light emitters may be used individually or in groups to emit one or more beams to stimulate emissions of one or more lumiphoric materials (e.g., phosphors, scintillators, lumiphoric inks, quantum dots, day glow tapes, etc.) to generate light at one or more peak wavelength, or of at least one desired perceived color (including combinations of colors that may be perceived as white). Lumiphoric materials may be provided in the form of particles, films, or sheets.

Inclusion of lumiphoric (also called 'luminescent') materials in lighting devices as described herein may be accomplished by any suitable means, including: direct coating on solid state emitters, dispersal in encapsulant materials arranged to cover solid state emitters; coating on lumiphor support elements (e.g., by powder coating, inkjet printing, or the like); incorporation into diffusers or lenses; and the like. Other materials, such as light scattering elements (e.g., particles) and/or index matching materials, may be associated with a lumiphoric material-containing element or surface. One or more lumiphoric materials useable in devices as described herein may be down-converting or up-converting, or can include a combination of both types.

In certain embodiments, at least one lumiphoric material may be spatially segregated ("remote") from and arranged to receive emissions from at least one electrically activated solid state emitter, with such spatial separation reducing thermal coupling between a solid state emitter and lumiphoric material. In certain embodiments, a spatially segregated lumiphor may be arranged to fully cover one or more electrically activated emitters of a lighting device. In certain embodiments, a spatially segregated lumiphor may be arranged to cover only a portion or subset of one or more emitters electrically activated emitters.

In certain embodiments, at least one lumiphoric material may be arranged with a substantially constant thickness and/or concentration relative to different electrically activated emitters. In certain embodiments, one or more lumiphoric materials may be arranged with presence, thickness, and/or concentration that vary relative to different emitters. Multiple lumiphors (e.g., lumiphors of different compositions) may be applied with different concentrations or thicknesses relative to different electrically activated emitters. In one embodiment, lumiphor presence, composition, thickness and/or concentration may vary relative to multiple electrically activated emitters. In certain embodiment, at least one lumiphoric material may be applied to a solid state emitter or a lumiphoric material support surface by patterning, such may be aided by one or more masks.

Various substrates may be used as mounting elements on which, in which, or over which multiple solid state light emitters (e.g., emitter chips) may be arranged or supported (e.g., mounted). Exemplary substrates include printed circuit boards (including but not limited to metal core printed circuit boards, flexible circuit boards, dielectric laminates, and the like) having electrical traces arranged on one or multiple surfaces thereof. A substrate, mounting plate, or other support element may include a printed circuit board (PCB), a metal core printed circuit board (MCPCB), a flexible printed circuit board, a dielectric laminate (e.g., FR-4 boards as known in the art) or any suitable substrate for mounting LED chips and/or LED packages. In certain embodiments, at least a portion of a substrate may include a dielectric material to provide desired electrical isolation between electrical traces or components of multiple LED sets. In certain embodiments, a substrate can comprise ceramic such as alumina, aluminum nitride, silicon carbide, or a polymeric material such as polyimide, polyester, etc.

In certain embodiments, one or more LED components can include one or more "chip-on-board" (COB) LED chips and/or packaged LED chips that can be electrically coupled or connected in series or parallel with one another and mounted on a portion of a substrate. In certain embodiments, COB LED chips can be mounted directly on portions of substrate without the need for additional packaging.

In certain embodiments, multiple solid state emitters or groups of solid state emitters may be arranged on a single substrate, submount, or mounting element. Current and/or duty cycle of different solid state emitters or groups of solid state emitters having different color points may be set (e.g., pre-set) or adjusted to achieve a mixture of light having an aggregate color point of a desired character. In certain embodiments, some emitters of the multiple solid state emitters or groups of solid state emitters may include or otherwise be arranged to stimulate emissions of one or more lumiphoric materials. In certain embodiments, all emitters of the multiple solid state emitters or groups of solid state emitters may include or otherwise be arranged to stimulate emissions of one or more lumiphoric materials. In certain embodiments, a lighting device may be devoid of any non-lumiphor-converted blue solid state emitter (i.e., the lighting device may be devoid of any electrically activated solid state light emitter arranged to generate emissions that have dominant wavelength in a range of from 430 nm to 480 nm and that exit the lighting device without passage through a layer or region comprising a lumiphoric material).

Certain embodiments may involve use of solid state emitter packages. A solid state emitter package may include at least one solid state emitter chip (more preferably multiple solid state emitter chips) that is enclosed with packaging elements to provide environmental protection, mechanical protection, color selection, and/or light focusing utility, as well as electrical leads, contacts, and/or traces enabling electrical connection to an external circuit. One or more emitter chips may be arranged to stimulate one or more lumiphoric materials, which may be coated on, arranged over, or otherwise disposed in light receiving relationship to one or more solid state emitters. At least one lumiphoric material may be arranged to receive emissions of at least some emitters of a plurality of solid state light emitters and responsively emit lumiphor emissions. A lens and/or encapsulant material, optionally including lumiphoric material, may be disposed over solid state emitters, lumiphoric materials, and/or lumiphor-containing layers in a solid state emitter package.

In certain embodiments, a light emitting apparatus as disclosed herein (whether or not including one or more LED packages) may include at least one of the following items arranged to receive light from multiple LEDs: a single leadframe arranged to conduct electrical power to the plurality of electrically activated solid state light emitters; a single reflector arranged to reflect at least a portion of light emanating from the plurality of electrically activated solid state light emitters; a single submount or mounting element supporting the plurality of electrically activated solid state light emitters; a single lens arranged to transmit at least a portion of light emanating from the plurality of electrically activated solid state light emitters; and a single diffuser arranged to diffuse at least a portion of light emanating from the plurality of electrically activated solid state light emitters. In certain embodiments, a light emitting apparatus including multiple LEDs may include at least one of the following items arranged to receive light from multiple LEDs: multiple lenses; multiple optical elements; and multiple reflectors. Examples of optical elements include, but are not limited to elements arranged to affect light mixing, focusing, collimation, dispersion, and/or beam shaping.

In certain embodiments, a package may include a molded lens arranged to transmit light emitted by multiple LEDs. As known in the art, a mold including one or more cavities can be arranged over a substrate (or a panel of substrate material, from which multiple substrates may be singulated by sawing or other means) and LED chips arranged thereon, with the mold comprising a lens material and/or encapsulant in liquid form. In certain embodiments, a lens may be formed of liquid curable silicone, and LED chips may be embedded in liquid silicone, which is subsequently cured to form one or more lenses. Alternatively, a lens may be pre-molded and then affixed (e.g., with adhesives, thermal bonding, or any other suitable joining method) to a subassembly including a substrate to which or over which with multiple LED chips are mounted.

In certain embodiments, a solid state lighting device (e.g., package) may include a reflector cup defining a cavity, at least one solid state emitter arranged within the cavity, and encapsulant material arranged within the cavity. In certain embodiments, at least one solid state emitter may be arranged over a substrate and at least partially surrounded by a boundary wall (optionally embodying at least one dispensed dam material laterally spaced from the emitter(s), with an encapsulant material arranged over the emitter(s) and in contact with the at least one boundary wall.

Various devices disclosed herein may include multiple solid state emitters (e.g., LEDs) of the same or different dominant colors, or of the same or different peak wavelengths. In certain embodiments, a solid state light emitting device may include at least three colors such as red, green, and blue emitters, which may include solid state light emitters devoid of phosphors, or may include phosphors (e.g., in combination with UV and/or blue emitters) to generate one or more of the red, green, and blue colors. Other combinations of output colors may be provided. In certain embodiments, a solid state light emitting device may include at least two colors.

The expressions "lighting device," "light emitting device," and "light emitting apparatus" as used herein are not limited, except that such elements are capable of emitting light. That is, a lighting device or light emitting apparatus can be a device which illuminates an area or volume, e.g., a structure, a swimming pool or spa, a room, a warehouse, an indicator, a road, a parking lot, a vehicle, signage, e.g., road signs, a billboard, a ship, a toy, a mirror, a vessel, an electronic device, a boat, an aircraft, a stadium, a computer, a remote audio device, a remote video device, a cell phone, a tree, a window, an LCD display, a cave, a tunnel, a yard, a lamppost, or a device or array of devices that illuminate an enclosure, or a device that is used for edge or back-lighting (e.g., backlight poster, signage, LCD displays), light bulbs, bulb replacements (e.g., for replacing AC incandescent lights, low voltage lights, fluorescent lights, etc.), outdoor lighting, street lighting, security lighting, exterior residential lighting (wall mounts, post/column mounts), ceiling fixtures/wall sconces, under cabinet lighting, lamps (floor and/or table and/or desk), landscape lighting, track lighting, task lighting, specialty lighting, ceiling fan lighting, archival/art display lighting, high vibration/impact lighting-work lights, etc., mirrors/vanity lighting, or any other light emitting devices. In certain embodiments, lighting devices or light emitting apparatuses as disclosed herein may be self-ballasted. In certain embodiments, a light emitting apparatus may be embodied in a light fixture.

In preferred embodiments, a solid state lighting device is devoid of any incandescent light emitting element. In certain embodiments, a solid state lighting device lacks any "unconverted" blue-emitting solid state emitter not arranged to stimulate emissions of a lumiphoric material.

The inventive subject matter further relates in certain embodiments to an illuminated enclosure (the volume of which can be illuminated uniformly or non-uniformly), comprising an enclosed space and at least one lighting device or light emitting apparatus as disclosed herein, wherein at least one lighting device or light emitting apparatus illuminates at least a portion of the enclosure (uniformly or non-uniformly). The inventive subject matter further relates to an illuminated area, comprising at least one item, e.g., selected from among the group consisting of a structure, a swimming pool or spa, a room, a warehouse, an indicator, a road, a parking lot, a vehicle, signage, e.g., road signs, a billboard, a ship, a toy, a mirror, a vessel, an electronic device, a boat, an aircraft, a stadium, a computer, a remote audio device, a remote video device, a cell phone, a tree, a window, a LCD display, a cave, a tunnel, a yard, a lamppost, etc., having mounted therein or thereon at least one lighting device or light emitting apparatus as described herein. Methods include illuminating an object, a space, or an environment, utilizing one or more lighting devices or light emitting apparatuses as disclosed herein. In certain embodiments, a lighting apparatus as disclosed herein includes multiple LED components arranged in an array (e.g., a two-dimensional array).

In certain embodiments, lighting devices as disclosed herein may provide emissions exhibiting enhanced vividness in combination with relatively high CRI Ra (e.g., according to one or more threshold ranges for GAI and CRI Ra recited herein) without use of any notch filtering material arranged to at least partially inhibit transmission of light. A notch filtering material when arranged on or in a light transmissive surface of a lighting device will inherently entail at least some attenuation of light and concomitant reduction of luminous efficacy. Presence of notch filtering material in a lighting device may also increase need for heat dissipating structures (e.g., heatsinks) since notch filtering material is subjected to being heated by absorbed light energy. As a result, providing a lighting device that is devoid of notch filtering material may avoid reduction of luminous efficacy, and may reduce need for heat dissipating structures, relative to a lighting device incorporating a notch filtering material.

In other embodiments, lighting devices as disclosed herein may include or have associated therewith one or more notch filtering materials, such as to enhance GAI and/or CRI Ra.

The term "notch filtering material" refers to a material that affects passage of light to cause light exiting the material to exhibit a spectral notch. A spectral notch is a portion of the color spectrum where the light is attenuated, thus forming a "notch" when light intensity is plotted against wavelength. Examples of notch filtering materials include rare earth and lanthanide materials, such as lanthanum, cerium, praseodymium, neodymium, promethium, samarium, europium, gadolinium, terbium, dysprosium, holmium, erbium, thulium, ytterbium, lutetium, scandium, and yttrium, as well as oxides thereof (e.g., neodymium oxide). Different rare earth compounds may exhibit notch filtering characteristics of different wavelength ranges. For example, neodymium (or oxide thereof) when used as a filtering material may produce a spectral notch in the yellow range, whereas erbium (or oxide thereof) when used as a filtering material may produce a spectral notch in the cyan range. Additional notch filtering materials include color pigments. As with the use of rare earth compounds, the use of color pigments can impart notch filtering properties in either transmissive or reflective applications. Example of a color pigments include an ultramarine pigment based on $CoAl_2O_4$ providing peak attenuation at a wavelength of about 580 nm, a cobalt blue pigment of similar composition could also be used, and color pigments based on $CuSO_4$ or $NiCl_2$. Notch filters may also be fabricated by depositing one or more dielectric layers (e.g., to form dielectric stacks) on substrates, such as filters commercially available from Thorlabs, Inc. (Newton, N.J., US).

In certain embodiments utilizing one or more notch filtering materials, a spectral notch provided by at least one filtering material may have a full width in a range of less than or equal to 40 nm, or less than or equal to 35 nm, or less than or equal to 30 nm, or less than or equal to 25 nm, or less than or equal to 20 nm, in each case corresponding to a half maximum relative reduction in light transmission. In certain embodiments utilizing one or more notch filtering materials, at least one filtering material may be arranged to filter light within (or overlapping) the yellow-green range or yellow range, such as to provide peak attenuation in a range of from 550 nm to 590 nm, or from 570 nm to 590 nm.

In embodiments utilizing notch filtering materials, a resulting notch filtered solid state lighting device may include emissions having a gamut area index (GAI) value in a range of from 80 to 100, preferably in combination with a color rendering index (CRI Ra) value of at least 75, more preferably at least 80, or more preferably at least 90. A notch filtering material according to certain embodiments may be arranged to provide a spectral notch having a full width of less than 40 nm corresponding to a half maximum relative reduction in light transmission. In certain embodiments, the notch filtering material may serve to attenuate intensity of emissions output by the solid state lighting device by at least 10%, or at least 20%, or at least 30%, or at least 40%, or at least 50%.

In embodiments utilizing notch filtering materials, such materials may be provided as microparticles or nanoparticles of any desired size, size distribution, and geometric shape. In certain embodiments, multiple notch filtering materials may be mixed and incorporated in a carrier material or binder, or multiple notch filtering materials may otherwise be used in combination (e.g., in sequential layers, with or without a binding medium) to provide multiple spectral notches. In certain embodiments, notch filtering materials may be arranged in or on an at least partially light-transmissive optical element or enclosure, which may serve as a lens and/or diffuser. Examples of desirable materials for carriers, binding media, enclosures, and/or optical elements include (but are not limited to) silicone, resin, epoxy, thermoplastic polycondensate, polymeric materials, and glass. In certain embodiments, such materials may be molded and/or cured together with at least one notch filtering material. In certain embodiments, a lighting device may include one or more transmissive optical elements and/or reflective optical elements incorporating at least one notch filtering material. For example, a so-called "troffer" style ceiling fixture may include a reflector that serves as an optical element, and may additionally include optical elements such as glass plates or lenses.

In certain embodiments utilizing notch filtering materials, at least one filtering material (e.g., notch filtering material) may be arranged with a substantially constant thickness and/or concentration relative to different electrically activated emitters (e.g., solid state emitters such as LEDs). In certain embodiments, one or more filtering materials may be arranged on or over at least one solid state emitter (optionally with an intervening lumiphoric material) with presence, composition, thickness, and/or concentration that vary relative to different emitters. Multiple filtering materials (e.g., filtering materials of different compositions and arranged to provide spectral notches at different wavelengths) may be applied to one or more electrically activated emitters. In certain embodiments, at least one filtering material may be applied over one or more solid state light emitters, or over a support surface (e.g., lens, diffuser, reflector, etc.) utilizing a patterning technique, such may be aided by one or more masks. In certain embodiments, one or more notch filtering materials may be integrated with or arranged in contact with one or more portions of a solid state emitter package.

In certain embodiments, a solid state (e.g., LED) lighting device may include multiple solid state light emitters and a control circuit configured to adjust aggregated emissions of the lighting device to produce a mixture of light having an adjustable color point together with high luminous efficacy, wherein at least one color point is on or near (e.g., within 7 MacAdam ellipses or within 5 MacAdam ellipses of) the WBL (line of minimum tint).

In certain embodiments, a lighting device may include a first electrically activated solid state emitter; a second electrically activated solid state emitter; and a control circuit configured to adjust aggregated light emissions of the solid state lighting device to move between at least two color points; wherein at least a first color point of the at least two color points embodies a combination of light exiting the lighting device that was emitted by the first electrically activated solid state emitter and the second electrically activated solid state emitter that produces, in the absence of any additional light, aggregated light emissions (i) having a luminous efficacy of at least 60 lumens per watt, and (ii) having (x, y) coordinates on a 1931 CIE Chromaticity Diagram that define a point on or within 7 MacAdam ellipses (or within 5 MacAdam ellipses) of a white body locus embodying a line including segments defined by the following x, y coordinates on a 1931 CIE Chromaticity Diagram: (0.3114, 0.3386) to (0.3462, 0.3631), (0.3462, 0.3631) to (0.3777, 0.3790), (0.3777, 0.3790) to (0.3977, 0.3707), (0.3977, 0.3707) to (0.4211, 0.3713), and (0.4211, 0.3713) to (0.4437, 0.3808). In certain embodiments, the lighting device may be devoid of any non-lumiphor-converted blue solid state emitter. In certain embodiments, aggregated light emissions of the solid state lighting device at (at least) the first color point may comprise one, some, or all of the following characteristics: a luminous efficacy of at least 60 lumens per watt; a luminous flux of at least 500 lumens; a CRI Ra value of at least 50 (or more preferably at least 60, 70, or 80, with any of the foregoing thresholds optionally being bounded by upper values of 81, 85, 90, or 95); and a GAI value of at least 80 (preferably in a range of from 80 to 100). In certain embodiments, at least one of the first electrically activated solid state emitter and the second electrically activated solid state emitter comprises a solid state light emitter including a dominant wavelength in a range of from 550 nm to 580 nm and including a luminous efficacy of at least 60 lumens per watt. In certain embodiments, the at least two color points differ in 1931 CIE Chromaticity Diagram (x, y) coordinate values by at least (0.01, 0.01). In certain embodiments, at least a first color point is non-coincident with (e.g., at least 5 MacAdam ellipses apart from, or at least 7 MacAdam ellipses apart from) a Planckian (blackbody) locus definable on a 1931 CIE Chromaticity Diagram. In certain embodiments, at least a first color point includes a CCT value in one of the following ranges: (i) from 2500K to 4000K; (ii) less than 4000K; or (iii) greater than 4100K. In certain embodiments, at least one solid state emitter comprises a light emitting diode and a lumiphoric material, wherein the lumiphoric material is arranged to receive at least a portion of emissions of the light emitting diode and responsively emit lumiphor emissions. In certain embodiments, a light bulb or lighting fixture may include the foregoing lighting device(s). In certain embodiments, a method comprises illuminating an object, a space, or an environment, utilizing the foregoing lighting device(s).

In certain embodiments, a lighting device including multiple solid state light emitters and a control circuit may include an adjustable color point to provide constant or nearly constant x-values of 1931 CIE coordinates; constant or nearly-constant y-values of 1931 CIE coordinates; or constant or nearly constant distance relative to the blackbody locus (e.g., together with variation in CCT of at least 100K).

In certain embodiments, a lighting device may include a first electrically activated solid state emitter; a second electrically activated solid state emitter; and a control circuit configured to adjust aggregated light emissions of the solid state lighting device to move between at least two color points; wherein at least a first color point of the at least two color points embodies a combination of light exiting the lighting device that was emitted by the first and the second electrically activated solid state emitter that produces, in the absence of any additional light, aggregated light emissions having (x, y) coordinates on a 1931 CIE Chromaticity Diagram that define a point on or within 7 MacAdam ellipses (or within 5 MacAdam ellipses) of a white body locus embodying a line including segments defined by the following x, y coordinates on a 1931 CIE Chromaticity Diagram: (0.3114, 0.3386) to (0.3462, 0.3631), (0.3462, 0.3631) to (0.3777, 0.3790), (0.3777, 0.3790) to (0.3977, 0.3707), (0.3977, 0.3707) to (0.4211, 0.3713), and (0.4211, 0.3713) to (0.4437, 0.3808); and wherein the at least two color points are related according to one of the following conditions (a) to (c): the at least two color points comprise a variation in x coordinate value of (x, y) coordinates on a 1931 CIE Chromaticity Diagram of less than 0.001; the at least two color points comprise a variation in y coordinate value of (x, y) coordinates on a 1931 CIE Chromaticity Diagram of less than 0.001; and the at least two color points, when plotted on a CIE 1976 u'-v' chromaticity diagram, differ in Delta u'v' values relative to one another by an amount of no greater than 0.01, and differ in correlated color temperature (CCT) values by an amount of at least 100K relative to one another. In certain embodiments, the first electrically activated solid state emitter may include a first LED having a dominant wavelength in a range of from 430 nm to 480 nm and a first lumiphor arranged to receive and be excited by at least a portion of emissions of the first LED, and emit lumiphor emissions including a dominant wavelength in a range of from 631 nm to 700 nm; and the second electrically activated solid state emitter may include a second LED having a dominant wavelength in a range of from 506 nm to 560 nm. In certain embodiments, the at least two color points may include at least three color points. In certain embodiments, the lighting device may be devoid of any non-lumiphor-converted blue solid state emitter. In certain embodiments, aggregated light emissions of the solid state lighting device at (at least) the first color point (or more preferably at each color point) may comprise one, some, or all of the following characteristics: a luminous efficacy of at least 60 lumens per watt; a luminous flux of at least 500 lumens; a CRI Ra value of at least 50 (more preferably at least 60, 70, or 80, with any of the foregoing thresholds optionally being bounded by upper values of 81, 85, 90, or 95); and a GAI value in a range of at least 80 (or preferably in a range of from 80 to 100). In certain embodiments, at least a first color point is non-coincident with (e.g., at least 5 MacAdam ellipses apart from, or at least 7 MacAdam ellipses apart from) a Planckian (blackbody) locus definable on a 1931 CIE Chromaticity Diagram. In certain embodiments, at least a first color point includes a CCT value in one of the following ranges: (i) from 2500K to 4000K; (ii) less than 4000K; or (iii) greater than 4100K. In certain embodiments, at least one solid state emitter comprises (and possibly multiple or all solid state emitters may comprise) a light emitting diode and a lumiphoric material, wherein the lumiphoric material is arranged to receive at least a portion of emissions of the light emitting diode and responsively emit lumiphor emissions. In certain embodiments, a light bulb or lighting fixture may include the foregoing lighting device(s). In certain embodiments, a method comprises illuminating an object, a space, or an environment, utilizing the foregoing lighting device(s).

In certain embodiments, a lighting device including multiple solid state light emitters and a control circuit may include an adjustable color point between one point on or near the Planckian (blackbody) locus and another point on or near the WBL with relatively constant CCT (e.g., CCT variation of 100K or less).

In certain embodiments, lighting device may include a first electrically activated solid state emitter; a second electrically activated solid state emitter; and a control system configured to adjust aggregated light emissions of the solid state lighting device to move between at least two color points; wherein at least a first color point of the at least two color points embodies a combination of light exiting the lighting device that was emitted by the first electrically activated solid state emitter and the second electrically activated solid state emitter that produces, in the absence of any additional light, aggregated light emissions having (x, y) coordinates on a 1931 CIE Chromaticity Diagram that define a point on or within 7 MacAdam ellipses (optionally within 4 or 5 MacAdam ellipses) of a white body locus embodying a line including segments defined by the following x, y coordinates on a 1931 CIE Chromaticity Diagram: (0.3114, 0.3386) to (0.3462, 0.3631), (0.3462, 0.3631) to (0.3777, 0.3790), (0.3777, 0.3790) to (0.3977, 0.3707), (0.3977, 0.3707) to (0.4211, 0.3713), and (0.4211, 0.3713) to (0.4437, 0.3808); wherein at least a second color point of the at least two color points embodies a combination of light exiting the lighting device that was emitted by the first electrically activated solid state emitter and the second electrically activated solid state emitter that produces, in the absence of any additional light, aggregated light emissions having (x, y) coordinates on a 1931 CIE Chromaticity Diagram that define a point on or within 10 MacAdam ellipses (optionally within 7 MacAdam ellipses, or within 4 or 5 MacAdam ellipses) of a Planckian locus; and wherein the at least a first color point and the at least a second color point differ in correlated color temperature (CCT) by a value of less than or equal to 100K relative to one another. In certain embodiments, the lighting device may be devoid of any non-lumiphor-converted blue solid state emitter. In certain embodiments, aggregated light emissions of the solid state lighting device at (at least) the first color point (or more preferably at each color point) may comprise one, some, or all of the following characteristics: a luminous efficacy of at least 60 lumens per watt; a luminous flux of at least 500 lumens; a CRI Ra value of at least 50 (more preferably at least 60, 70, or 80, with any of the foregoing thresholds optionally being bounded by upper values of 81, 85, 90, or 95); and a GAI value in a range of at least 80 (or preferably in a range of from 80 to 100). In certain embodiments, the at least two color points may differ in 1931 CIE Chromaticity Diagram (x, y) coordinate values by at least (0.01, 0.01). In certain embodiments, at least a first color point is non-coincident with (e.g., at least 5 MacAdam ellipses apart from, or at least 7 MacAdam ellipses apart from) a Planckian (blackbody) locus definable on a 1931 CIE Chromaticity Diagram. In certain embodiments, at least a first color point includes a CCT value in one of the following ranges: (i) from 2500K to 4000K; (ii) less than 4000K; or (iii) greater than 4100K. In certain embodiments, at least one solid state emitter comprises (and possibly multiple or all solid state emitters may comprise) a light emitting diode and a lumiphoric material, wherein the lumiphoric material is arranged to receive at least a portion of emissions of the light emitting diode and responsively emit lumiphor emissions. In certain embodiments, a light bulb or lighting fixture may include the foregoing lighting device(s). In certain embodiments, a method comprises illuminating an object, a space, or an environment, utilizing the foregoing lighting device(s).

In certain embodiments, lighting device including multiple solid state light emitters and a control circuit may include an adjustable color point to provide a first color point on or near the WBL and a second color point having significantly different CCT and luminous flux.

In certain embodiments, a lighting device may include a first electrically activated solid state emitter; a second electrically activated solid state emitter; and a control system configured to adjust aggregated light emissions of the solid state lighting device to move between at least two color points; wherein at least a first color point of the at least two color points embodies a combination of light exiting the lighting device that was emitted by the first electrically activated solid state emitter and the second electrically activated solid state emitter that produces, in the absence of any additional light, aggregated light emissions having a first correlated color temperature (CCT) value and having (x, y) coordinates on a 1931 CIE Chromaticity Diagram that define a point on or within 7 MacAdam ellipses of a white body locus embodying a line including segments defined by the following x, y coordinates on a 1931 CIE Chromaticity Diagram: (0.3114, 0.3386) to (0.3462, 0.3631), (0.3462, 0.3631) to (0.3777, 0.3790), (0.3777, 0.3790) to (0.3977, 0.3707), (0.3977, 0.3707) to (0.4211, 0.3713), and (0.4211, 0.3713) to (0.4437, 0.3808); and wherein at least a second color point of the at least two color points embodies a combination of light exiting the lighting device that was emitted by the first electrically activated solid state emitter and the second electrically activated solid state emitter that produces, in the absence of any additional light, aggregated light emissions having a second correlated color temperature (CCT) value; wherein the first CCT value and the second CCT value differ by at least 500K; and wherein aggregated light emissions at the first color point and aggregated light emissions at the second color point differ in luminous flux by at least 30% (optionally by at least 20%, at least 40%, or at least 50%). Utilization of emitters providing different luminous flux values (e.g., differing by at least 30%) allows for increased utilization of die area, and may therefore permit cost to be reduced. In certain embodiments, the lighting device may be devoid of any non-lumiphor-converted blue solid state emitter. In certain embodiments, aggregated light emissions of the solid state lighting device at (at least) the first color point (or more preferably at each color point) may comprise one, some, or all of the following characteristics: a luminous efficacy of at least 60 lumens per watt; a luminous flux of at least 500 lumens; a CRI Ra value of at least 50 (more preferably at least 60, 70, or 80, with any of the foregoing thresholds optionally being bounded by upper values of 81, 85, 90, or 95); and a GAI value in a range of at least 80 (or preferably in a range of from 80 to 100). In certain embodiments, at least a first color point is non-coincident with (e.g., at least 7 MacAdam ellipses apart from) a Planckian (blackbody) locus definable on a 1931 CIE Chromaticity Diagram. In certain embodiments, at least a first color point includes a CCT value in one of the following ranges: (i) from 2500K to 4000K; (ii) less than 4000K; or (iii) greater than 4100K. In certain embodiments, at least one solid state emitter comprises (and possibly multiple or all solid state emitters may comprise) a light emitting diode and a lumiphoric material, wherein the lumiphoric material is arranged to receive at least a portion of emissions of the light emitting diode and responsively emit lumiphor emissions. In certain embodiments, a light bulb or lighting fixture may include the foregoing lighting device(s). In certain embodiments, a method comprises illuminating an object, a space, or an environment, utilizing the foregoing lighting device(s).

In certain embodiments, a lighting device including first and second solid state light emitters and a control circuit may include an adjustable color point including one point on or near the WBL, wherein the first emitter is arranged to produce light emissions in a first bin defining a first continuous region occupying a first area not exceeding 10% (optionally not exceeding 8%, 6%, 5%, 4%, 3%, or 2%) of a 1931 CIE Chromaticity diagram and the second emitter is arranged to produce light emissions in a second bin defining a second continuous region occupying a second area not exceeding 10% (optionally not exceeding 8%, 6%, 5%, 4%, 3%, or 2%) of a 1931 CIE Chromaticity diagram, and the device is devoid of solid state emitters outside the first bin or the second bin In certain embodiments, a lighting device may include at least one first electrically activated solid state light emitter arranged to produce, in the absence of any additional light, light emissions within a first bin defining a first continuous region occupying an area not exceeding 10% (optionally not exceeding 8%, 6%, 5%, 4%, 3%, or 2%) of a 1931 CIE Chromaticity Diagram; at least one second electrically activated solid state light emitter arranged to produce, in the absence of any additional light, light emissions within a second bin defining a second continuous region occupying an area not exceeding 10% (optionally not exceeding 8%, 6%, 5%, 4% 3%, or 2%) of a 1931 CIE Chromaticity Diagram, wherein the second continuous region is non-overlapping with the first continuous region, and the at least one first electrically activated solid state light emitter is independently controllable relative to the at least one second electrically activated solid state light emitter; a control circuit configured to adjust aggregated light emissions of the solid state lighting device to move between at least two color points; wherein at least a first color point of the at least two color points embodies a combination of light exiting the lighting device that was emitted by the first electrically activated solid state emitter and the second electrically activated solid state emitter that produces, in the absence of any additional light, aggregated light emissions having (x, y) coordinates on a 1931 CIE Chromaticity Diagram that define a point on or within 7 MacAdam ellipses of a white body locus embodying a line including segments defined by the following x, y coordinates on a 1931 CIE Chromaticity Diagram: (0.3114, 0.3386) to (0.3462, 0.3631), (0.3462, 0.3631) to (0.3777, 0.3790), (0.3777, 0.3790) to (0.3977, 0.3707), (0.3977, 0.3707) to (0.4211, 0.3713), and (0.4211, 0.3713) to (0.4437, 0.3808); and wherein the solid state lighting device is devoid of any electrically activated solid state light emitter arranged to produce, in the absence of any additional light, light emissions outside either the first bin or the second bin. In certain embodiments, area of each of the first bin and the second bin is non-overlapping with a Planckian locus definable on a 1931 CIE Chromaticity Diagram. In certain embodiments, the lighting device may be devoid of any non-lumiphor-converted blue solid state emitter. In certain embodiments, the at least one first electrically activated solid state light emitter may be arranged to output a first dominant wavelength; the at least one second electrically activated solid state light emitter may be arranged to output a second dominant wavelength; and the first dominant wavelength and the second dominant wavelength are complementary and differ by at least 50 nm. In certain embodiments, aggregated light emissions of the solid state lighting device at (at least) the first color point (or more preferably at each color point) may comprise one, some, or all of the following characteristics: a luminous efficacy of at least 60 lumens per watt; a luminous flux of at least 500 lumens; a CRI Ra value of at least 50 (more preferably at least 60, 70, or 80, with any of the foregoing thresholds optionally being bounded by upper values of 81, 85, 90, or 95); and a GAI value in a range of at least 80 (or preferably in a range of from 80 to 100). In certain embodiments, at least a first color point is non-coincident with (e.g., at least 7 MacAdam ellipses apart from) a Planckian (blackbody) locus definable on a 1931 CIE Chromaticity Diagram. In certain embodiments, at least a first color point includes a CCT value in one of the following ranges: (i) from 2500K to 4000K; (ii) less than 4000K; or (iii) greater than 4100K. In certain embodiments, at least one solid state emitter comprises (and possibly multiple or all solid state emitters may comprise) a light emitting diode and a lumiphoric material, wherein the lumiphoric material is arranged to receive at least a portion of emissions of the light emitting diode and responsively emit lumiphor emissions. In certain embodiments, a light bulb or lighting fixture may include the foregoing lighting device(s). In certain embodiments, a method comprises illuminating an object, a space, or an environment, utilizing the foregoing lighting device(s).

In certain embodiments, a solid state lighting device may include a first solid state emitter arranged to produce light emissions in a first bin defining a first continuous region occupying a first area not exceeding 10% (optionally not exceeding 8%, 6%, 5%, 4%, 3%, or 2%) of a 1931 CIE Chromaticity diagram and a second solid state emitter arranged to produce light emissions in a second bin defining a second continuous region occupying a second area not exceeding 10% (optionally not exceeding 8%, 6%, 5%, 4%, 3%, or 2%) of a 1931 CIE Chromaticity diagram and non-overlapping with the first region, a combination of light produces a color point on or near the WBL, and the device is devoid of solid state emitters outside the first bin or the second bin. The resulting color point for the combination of light may be non-adjustable.

In certain embodiments, a lighting device may include at least one first electrically activated solid state light emitter arranged to produce, in the absence of any additional light, light emissions within a first bin defining a first continuous region occupying an area not exceeding 10% (optionally not exceeding 8%, 6%, 5%, 4%, 3%, or 2%) of a 1931 CIE Chromaticity Diagram; at least one second electrically activated solid state light emitter arranged to produce, in the absence of any additional light, light emissions within a second bin defining a second continuous region occupying an area not exceeding 10% (optionally not exceeding 8%, 6%, 5%, 4%, 3%, or 2%) of a 1931 CIE Chromaticity Diagram; and a first power line, wherein each of the at least one first and the at least one second solid state light emitter is electrically connected to the first power line; wherein the second continuous region is non-overlapping with the first continuous region, and the at least one first electrically activated solid state light emitter is independently controllable relative to the at least one second electrically activated solid state light emitter; wherein a combination of light exiting the lighting device that was emitted by the first electrically activated solid state emitter and the second electrically activated solid state emitter produces, in the absence of any additional light, aggregated light emissions having (x, y) coordinates on a 1931 CIE Chromaticity Diagram that define a color point on or within 7 MacAdam ellipses of a white body locus embodying a line including segments defined by the following x, y coordinates on a 1931 CIE Chromaticity Diagram: (0.3114, 0.3386) to (0.3462, 0.3631), (0.3462, 0.3631) to (0.3777, 0.3790), (0.3777, 0.3790) to (0.3977, 0.3707), (0.3977, 0.3707) to (0.4211, 0.3713), and (0.4211, 0.3713) to (0.4437, 0.3808); and wherein the solid state lighting device is devoid of any electrically activated solid state light emitter arranged to produce, in the absence of any additional light, light emissions outside either the first bin or the second bin. In certain embodiments, a light bulb or lighting fixture may include the foregoing lighting device(s). In certain embodiments, a method comprises illuminating an object, a space, or an environment, utilizing the foregoing lighting device(s).

Various features and embodiments of the present disclosure are described with reference to the accompanying figures.

FIG. 5A illustrates a solid state emitter package 100 including multiple solid state light emitters as described herein. The emitter package 100 includes multiple (e.g., four) LED chips 150A-150D that may be separately controlled (e.g., via backside anodes 121A-121D and cathodes 122A-122D) and that are supported by an insulating substrate 110. The substrate 110, which may preferably comprise a ceramic material, includes an upper surface 111, a lower surface 112, and side walls 113-116 extending between the upper surface 111 and the lower surface 112. Electrical traces 140 are arranged over the substrate 110, including multiple die attach pads 141A-141D and additional electrical elements 142A-142D arranged proximate to the die attach pads 141A-141D. Where the die attach pads 141A-141D are electrically conductive, the LED chips 150A-150D may be arranged with bottom side contacts thereof in electrical communication with the die attach pads 141A-141D, and with top side contacts thereof in electrical communication with the electrical elements 142A-142D by way of wirebonds 152. The die attach pads 141A-141D and electrical elements 142A-142D may comprise one or more metals patterned on (or in) the top surface 111 of the substrate 110. Gaps 145 may be provided between adjacent die attach pads 141A-141D and/or electrical elements 142A-142D to prevent undesired conductive electrical communication. In certain embodiments, die attach pads need not be electrically conductive, such as in cases where anode and cathode connections to a solid state emitter chip are both made with wirebonds. An insulating soldermask 147 is patterned over peripheral portions of the electrical traces 140, and a molded lens 160 (e.g., including a raised or hemispherical portion 161 and a base portion 162) is arranged over the top surface 111 of the substrate 110 and is arranged to transmit at least a portion of light generated by the emitter chips 150A-150D.

LED chips 150A-150D of any suitable peak wavelength (e.g., color) may be used, and one, some, or all of the chips 150A-150D may be arranged to stimulate emissions of one or more lumiphors (e.g., phosphors). Although some or all of the LED chips 150A-150D may be separately controlled, in certain embodiments groups of two or more LED chips 150A-150D or groups of LED chips may be controlled together in a groupwise fashion. As noted previously, the package 100 may embody one or more LED components, with each LED component comprising at least one LED chip 150A-150D (optionally multiple LED chips), with one or more LED chips 150A-150D optionally arranged to stimulate emissions of one or more lumiphoric materials. In certain embodiments, the solid state emitter package 100 may include two LED components, with each LED component including two LED chips 150A-150D. In certain embodiments, the solid state emitter package 100 may include one, two, three, or four LED components. Although four LED chips 150A-150D are illustrated in FIG. 5A, it is to be appreciated that a LED package may include any desirable number of LED chips, including groups of chips arranged in series, in parallel, or in series-parallel configurations.

FIG. 5B is a bottom plan view of each of the emitter package 100 of FIG. 5A. A bottom surface 112 of the substrate includes four anodes 121A-121D and four cathodes 122A-122D patterned thereon (e.g., as electrical traces), with one paired anode/cathode per quadrant. The separate anodes 121A-121D and cathodes 122A-122D enable separate control of the multiple LED chips 150A-150B if desired. The various anodes 121A-121D and cathodes 122A-122D are separated by gaps that may be filled with solder mask material sections 127-1, 127-2. A thermal element (e.g., thermal spreading element) 126 may be arranged along the bottom surface 112 between the solder mask material sections 127-1, 127-2 and generally underlapping the solid state emitters 150A-150D. The thickness of the thermal element 126 may be the same as or different from (e.g., thicker than) the anodes 121A-121D and cathodes 122A-122D. As shown, the package 100 is devoid of any anode or cathode arranged on, or extending laterally beyond, any side wall 113-116 thereof.

FIG. 6A illustrates a lighting emitting device 200 including first and second emitter components 201, 202 supported in or on a substrate or other body structure 209. The first and second emitter components 201, 202 each include at least one LED chip 203A-203B, wherein any one or more of the LED chips 203A-203B may be optionally arranged to stimulate emissions of one or more lumiphoric materials (e.g., such as lumiphor 205A arranged to be stimulated by LED chip 205A). Although FIG. 6A illustrates one LED chip 203A-203B as being associated with each emitter component 201, 202, it is to be appreciated that any suitable number (e.g., two, three, four, five, six or more, etc.) of LED chips may be associated with one or more emitter components in certain embodiments.

FIG. 6B illustrates a lighting emitting device 210 including first and second emitter components 211, 212 supported in or on a substrate or other body structure 219. The first and second emitter components 211, 212 each include at least one LED chip 213A-213B, wherein any one or more of the LED chips 213A-213B may be optionally arranged to stimulate emissions of one or more lumiphoric materials (e.g., such as a first lumiphor 215A arranged to be stimulated by a first LED chip 215A and a second lumiphor 216A arranged to be stimulated by a second LED chip 214A).

FIG. 6C illustrates a lighting emitting device 220 including first and second emitter components 221, 222 supported in or on a substrate (or other body structure) 229. The first emitter component 221 includes LED chips 223A, 223B with a first LED chip 223A arranged to stimulate emissions of a first lumiphor 225A, and the second emitter component 222 includes a LED chip 224A arranged to stimulate emissions of a second lumiphor 226A. In certain embodiments, any suitable number of LED chips and lumiphors may be provided in each emitter component, and additional emitter components (not shown) may be supported by the substrate 229.

FIG. 6D illustrates a lighting emitting device 230 including first and second emitter components 231, 232 supported in or on a substrate or other body structure 239. The first emitter component 231 includes a first LED chip 233A arranged to stimulate emissions of a first lumiphor 235A and a second LED chip 233B arranged to stimulate emissions of a second lumiphor 235B, and the second emitter component 232 includes a LED chip 234A arranged to stimulate emissions of another lumiphor 236A. In certain embodiments, any suitable number of LED chips and lumiphors may be provided in each emitter component, and additional emitter components (not shown) may be supported by the substrate 239.

FIG. 6E illustrates a lighting emitting device 240 including first and second emitter components 241, 242 supported in or on a substrate or other body structure 249. The first emitter component 241 includes a first LED chip 243A arranged to stimulate emissions of a first lumiphor 245A and a second LED chip 243B arranged to stimulate emissions of a second lumiphor 245B. The second emitter component 242 includes a first LED chip 244A arranged to stimulate emissions of a first lumiphor 246A and a second LED chip 244B arranged to stimulate emissions of a second lumiphor 246B. One or more lumiphoric materials 245A, 245B, 246A, 246B may be the same or different in the respective LED components 241, 242. In certain embodiments, any suitable number of LED chips and lumiphors may be provided in each emitter component, and additional emitter components (not shown) may be supported by the substrate 249.

FIG. 6F illustrates a lighting emitting device 250 including first and second emitter components 251, 252 supported in or on a substrate or other body structure 259. The first emitter component 251 includes a first LED chip 253A arranged to stimulate emissions of a first lumiphor 255A in addition to a second LED chip 253B, and the second emitter component 252 includes a first LED chip 254A arranged to stimulate emissions of a first lumiphor 256A in addition to a second LED chip 254B. In certain embodiments, any suitable number of LED chips and lumiphors may be provided in each emitter component, and additional emitter components (not shown) may be supported by the substrate 259.

With general reference to FIGS. 6A-6F, the first and second emitter components in each instance may embody any suitable LED chips, lumiphors, features, and/or capabilities as described herein, and are preferably separately controllable (but may be controlled together). Additional emitter components (not shown) including one or more LED chips may be further provided in or on the substrate in each instance. In embodiments including one or more emitter components with multiple LEDs, each LED within a single LED component may be individually controlled, or groups of two or more LEDs within a single component may be controlled together.

With continued reference to FIGS. 6A-6F, in certain embodiments each first emitter component may be arranged to produce emissions (or a mixture of emissions) having a first color point, each second emitter component may be arranged to produce emissions (or a mixture of emissions) have a second color point, and a mixture of light generated by the respective first and second emitter component for each device may be arranged to yield an aggregate color point. In certain embodiments, adjustment of current or current pulse width to the first emitter component (and/or individual emitters thereof) relative to the second emitter component may be used to adjust the aggregate color point. In certain embodiments, the aggregate color point is on or near (e.g., within 7 MacAdam ellipses of) the WBL or line of minimum tint. In certain embodiments, current or current pulse width to the first emitter component (and/or individual emitters thereof) relative to the second emitter component may yield an adjustable color point to provide constant or nearly constant x-values of 1931 CIE coordinates; constant or nearly-constant y-values of 1931 CIE coordinates; or constant or nearly constant distance relative to the blackbody locus (e.g., together with variation in CCT of at least 100K for first and second aggregate color points). In certain embodiments, color point may be generated to provide a first aggregate color point on or near the WBL and a second aggregate color point having significantly different CCT and luminous flux. In certain embodiment, emissions of a first emitter component may produce light emissions in a first bin defining a first continuous region occupying a first area not exceeding 10% (optionally not exceeding 8%, 6%, 5%, 4%, 3%, or 2%) of a 1931 CIE Chromaticity diagram, emissions of a second emitter component may produce light emissions in a second bin defining a second continuous region (not overlapping the first continuous region) occupying a second area not exceeding 10% (optionally not exceeding 8%, 6%, 5%, 4%, 3%, or 2%) of a 1931 CIE Chromaticity diagram (with the device being devoid of any emitters or emitter components separately arranged to produce light emissions outside the first bin or the second bin), and aggregate emissions may be controlled to yield at least one color point on or near the WBL.

In certain embodiments, at least three emitters or combinations of emitters each having a different color point may be separately controlled in order to produce a mixture of light having an aggregate color point that may be adjusted.

FIG. 7 illustrates a portion of a first control circuit arranged to control multiple strings 281, 282, 283 of solid state emitters (e.g., LEDs) 293a, 293b, 294a, 294b, 295a, 295b all being electrically connected to a common power line 280. Connected to the first string 281 are a first current regulator 285 and a first group of LEDs 293A, 293B, which may be arranged to output the same of different dominant wavelengths, and may optionally be arranged to stimulate emissions of one or more lumiphoric materials. Connected to the second string 282 are a second current regulator 286 and a second group of LEDs 294A, 294B, which may be arranged to output the same of different dominant wavelengths, and may optionally be arranged to stimulate emissions of one or more lumiphoric materials. Connected to the third string 283 are a third current regulator 287 and a third group of LEDs 295A, 295B, which may be arranged to output the same of different dominant wavelengths, and may optionally be arranged to stimulate emissions of one or more lumiphoric materials. The current regulators 285-287 may be used to regulate currents through the respective strings 281-283 to any desired value. In certain embodiments, the number of LEDs in each string 281-283 may be the same or different.

FIG. 8 illustrates interconnections between various components of a light emitting apparatus 300 including first and second LED components (or LEDs) 301, 302 arranged in series, with at least one control circuit 310 arranged to control modulation of current and/or duty cycle of the LED components 301, 302 using controllable bypass and/or shunt elements 311, 312. In certain embodiments, each LED component 301, 302 may include one or more (optionally, all) LEDs (not shown) arranged to stimulate emissions of one or more lumiphors. In certain embodiments, each LED component 301, 302 may include multiple LEDs arranged in series, in parallel, or in series/parallel configurations. The at least one control circuit 310 may optionally be controlled responsive to one or more user input elements 306, one or more timer elements 307, and/or one or more sensor elements 308 (e.g., temperature sensing element, photosensors, etc.). Various components of the light emitting apparatus 300 may be supported by, arranged on, or arranged in electrical communication with portions of a substrate or other support element 309. In operation, current is applied to the lighting apparatus 300 between anode 321A and cathode 321B. Supply of current to, and/or duty cycle of, a first LED component 301 may be controlled with a first controllable bypass or shunt element 311. Similarly, supply of current to, and/or duty cycle of, a second LED component 302 may be controlled with a second controllable bypass or shunt element 312, with the second LED component 302 arranged in series with the first LED component 301. Each of the first and second controllable bypass or shunt elements 311, 312 may be controlled by at least one control circuit 310, optionally in response one or more user input elements 306, one or more timer elements 307, and/or one or more sensor elements 308.

FIG. 9 illustrates interconnections between various components of a light emitting apparatus 400 including first and second LED components 401, 402 arranged in parallel, with at least one control circuit 410 (e.g., optionally including control circuit portions 410A, 410B) arranged to control modulation of current and/or duty cycle of the LED components 401, 402 using controllable bypass and/or shunt elements 411, 412. In certain embodiments, each LED component 401, 402 may include one or more (optionally, all) LEDs (not shown) arranged to stimulate emissions of one or more lumiphors. In certain embodiments, each LED component 401, 402 may include multiple LEDs arranged in series, in parallel, or in series/parallel configurations. The at least one control circuit 410 may optionally be controlled responsive to one or more user input elements 406, one or more timer elements 407, and/or one or more sensor elements 408. Various components of the light emitting apparatus 400 may be supported by, arranged on, or arranged in electrical communication with portions of a substrate or support element 409. In operation, current may be supplied to the first LED component 401 via a first anode 421A and cathode 421B, wherein supply of current to, and/or duty cycle of, the first LED component 401 may be modulated with a first controllable bypass or shunt element 411. In a like manner, current may be supplied to the second LED component 402 via a second anode 422A and cathode 422B, wherein supply of current to, and/or duty cycle of, the second LED component 402 may be modulated with a second controllable bypass or shunt element 412. The first and second controllable bypass or shunt elements 411, 412 may be controlled by at least one control circuit 410 (optionally with dedicated portions 410A, 410B), optionally in response one or more user input elements 406, one or more timer elements 407, and/or one or more sensor elements 408.

FIG. 10 is a CIE 1931 chromaticity diagram showing the blackbody locus (BBL), overlaid with the white body line (WBL), and a first line "A", a second line "B", and a third line "C" that separately intersect the white body line and that each embody potential combinations of color points that may be mixed to yield an aggregate color point on or near the WBL.

The first line "A" is horizontal, extending from a first endpoint at the left boundary of the chromaticity diagram (at approximately 493 nm) to a second endpoint at the right boundary thereof (at approximately 600 nm). Color points A1 and A2 are intermediately arranged between the preceding endpoints. In one embodiment, at least one first solid state emitter (which may optionally include at least one lumiphor) may be arranged to generate emissions having the color point A1, at least one second solid state emitter (which may optionally include at least one lumiphor) may be arranged to generate emissions having the color point A2, and a mixture of light produced by the foregoing emitters may yield an aggregate color point D that is on (or near, such as within 7 MacAdam ellipses of) the WBL. It is to be appreciated that any two emitters arranged to generate separate color points along the first line "A" may be combined to yield one or more aggregate color points that are intermediately arranged between the separate color points, such as by adjusting relative output of the emitters. In certain embodiments, where at least two color points may be obtained, the at least two color points may preferably comprise a variation in x coordinate value of (x, y) coordinates on the 1931 CIE Chromaticity Diagram of less than 0.001.

The second line "B" is vertical, extending from a first (upper) endpoint along the left boundary of the chromaticity diagram (at approximately 567 nm) to a second (lower) endpoint at the chromaticity boundary line. Color points B1 and B2 are intermediately arranged between the preceding endpoints. In one embodiment, at least one first solid state emitter (which may optionally include at least one lumiphor) may be arranged to generate emissions having the color point B1, at least one second solid state emitter (which may optionally include at least one lumiphor) may be arranged to generate emissions having the color point B2, and a mixture of light produced by the foregoing emitters may yield an aggregate color point D that is on (or near) the WBL. It is to be appreciated that any two emitters arranged to generate separate color points along the second line "B" may be combined to yield one or more aggregate color points that are intermediately arranged between the separate color points, such as by adjusting relative output of the emitters. In certain embodiments, where at least two color points may be obtained, the at least two color points may preferably comprise a variation in y coordinate value of (x, y) coordinates on the 1931 CIE Chromaticity Diagram of less than 0.001.

The third line "C" is diagonal, extending from a first endpoint at the left boundary of the chromaticity diagram (at approximately 485 nm) to a second endpoint (corresponding to color point C2) at the right boundary thereof (at approximately 588 nm). Color point C1 is intermediately arranged between the preceding endpoints. In one embodiment, at least one first solid state emitter (which may optionally include at least one lumiphor) may be arranged to generate emissions having the color point C1, at least one second solid state emitter (which may optionally include at least one lumiphor) may be arranged to generate emissions having the color point C2, and a mixture of light produced by the foregoing emitters may yield an aggregate color point D that is on (or near) the WBL. It is to be appreciated that any two emitters arranged to generate separate color points along the third line "C" may be combined to yield one or more aggregate color points that are intermediately arranged between the separate color points, such as by adjusting relative output of the emitters. In certain embodiments, where at least two color points may be obtained, the at least two color points, when plotted on a CIE 1976 u'-v' chromaticity diagram, differ in Delta u'v' values relative to one another by an amount of no greater than 0.01, while differing in correlated color temperature (CCT) values by an amount of at least 100K relative to one another.

FIG. 11 is a CIE 1931 chromaticity diagram showing the blackbody locus (BBL), overlaid with the line of minimum tint (or "white body line") (WBL), and two corresponding pairs of color point bins J1-J2 and K1-K2. Each color point bin encompasses color points that may be obtained by one or more solid state emitters (optionally including one or more lumiphoric materials). Each bin K1, J2, K1, K2 defines a continuous region occupying an area of the CIE 1931 diagram, with each area preferably not exceeding a desired threshold such as not exceeding 10% (optionally not exceeding 8%, 6%, 5%, 4%, 3%, or 2%) of the 1931 CIE diagram. In certain embodiments, corresponding bins may have substantially equal areas. In certain embodiments, corresponding bins may each comprise a centroid that is substantially equidistant from the WBL; in other embodiments, centroids of corresponding bins may be non-equidistant from the WBL. As shown in FIG. 11, each bin K1, J2, K1, K2 is non-overlapping with respect to the other. Each bin K1, J2, K1, K2 may be independently selected to have any suitable shape, such as a rectangle, circle, oval, trapezoid, parallelogram, rounded rectangle, etc. In certain embodiments, corresponding bins may have substantially the same or substantially different shapes. In certain embodiments, one or more bins may be devoid of color points at the perimeter of the CIE 1931 chromaticity diagram; in other embodiments, one or more bins may encompass at least one color point at a boundary of the CIE 1931 diagram. As shown in FIG. 11, a first line connecting the first pair of color point bins J1-J2 intersects the WBL at a first color point J (with such line also intersecting the BBL at a different point). A second line connecting the second pair of color point bins K1-K2 intersects the WBL at a second color point K (with such line also intersecting the BBL at a different point). In certain embodiments, a solid state lighting device may include at least one first solid state emitter arranged to produce light emissions having a color point in a first bin J1 (or alternatively K1) and at least one second solid state emitter arranged to produce light emissions having a color point in a second bin J2 (or alternatively K2), wherein a combination of light produced by the at least one first and the at least one second solid state emitter (which may optionally include one or more lumiphoric materials) produces an aggregate or combined color point (e.g., point J, or alternatively point K) on (or near) the WBL, and the lighting device is devoid of any solid state light emitters arranged to generate emissions outside the first bin or the second bin. In certain embodiments, the (at least one) first solid state emitter and the (at least one) second solid state emitter may be separately controlled to permit adjustment of the aggregate or combined color point. In alternative embodiments, the aggregate or combined color point may be pre-set (e.g., non-adjustable in character).

FIG. 12 illustrates a CIE 1976 (u'v') chromaticity diagram showing the blackbody locus, showing identified regions of different colors or hues, and showing a curved dashed line "M" embodying color points (e.g., including points M1 and M2) obtainable with solid state emitters and/or lighting devices disclosed herein, wherein the line of color points (e.g., including points M1 and M2) embodies a substantially constant distance from corresponding points of the BBL. In the context of a CIE 1976 chromaticity diagram, points having the same constant Delta u'v' value are equidistant from the BBL. In certain embodiments, the dashed line M (or a relocated version thereof) may intersect with at least one point on the WBL (not shown). In certain embodiments, the dashed line M (or a relocated version thereof) may embody at least two color points or optionally at least three color points (obtainable with solid state emitters and/or lighting devices disclosed herein) that differ in Delta u'v' values relative to one another by an amount of no greater than 0.01, and differ in correlated color temperature (CCT) values by an amount of at least 100K relative to one another.

FIG. 13 illustrates a lighting apparatus (e.g., light fixture) 510 according to at least one embodiment. The apparatus 500 includes a substrate or mounting plate 575 to which multiple solid state emitter (e.g., LED) lamps 570-1 to 570-6 (optionally embodied in multi-chip lamps such as multi-chip LED packages) are attached, wherein each lamp 570-1 to 570-6 may include multiple LEDs as described herein. Each lamp 570-1 to 570-6 may optionally include a cluster of solid state emitters, including at least one lumiphor converted solid state emitter and at least one supplemental solid state emitter as disclosed herein. The mounting plate 575 may include a circular shape or any suitable shape or configuration (including non-planar and curvilinear configurations). Different solid state emitter lamps or clusters may be configured to emit the same or different colors (e.g., wavelengths) of light. With specific reference to a first solid state lamp 570-1, each solid state lamp 570-1 to 570-6 may include multiple solid state emitters (e.g., LEDs) 574A-574C preferably arranged on a single submount 561. Although FIG. 13 illustrates four solid state emitter chips as being associated with each multi-chip solid state lamp 570-1 to 570-6, it is to be appreciated that any suitable number of solid state emitter chips may be associated with each multi-chip solid state lamp 570-1 to 570-6, and the number of solid state emitter chips associated with different (e.g., multi-chip) solid state lamps may be different. Preferably, solid state lamps with different output characteristics may be intentionally provided in a single fixture 510, whereby separate control of lamps arranged to output different color points may enable the fixture to be adjusted to provide aggregate emissions having different (e.g., two or more different) color points according to one or more adjustment schemes disclosed herein—preferably including at least one aggregate color point on or near the WBL in certain embodiments.

The solid state lamps 570-1 to 570-6 may be grouped on the mounting plate 575 in clusters or other arrangements so that the light fixture 510 outputs a desired pattern of light. In certain embodiments, at least one state emitter lamp associated with a single fixture 510 includes a lumiphor-converted light emitting component. With continued reference to FIG. 13, the light fixture 510 may include one or more control circuit components 580 arranged to operate the lamps 570-1 to 570-6 by independently applying currents and/or adjusting duty cycle of respective LED components or groups thereof. In certain embodiments, individual solid state chip 564A-564D in various lamps 570-1 to 570-6 may be configured to be individually addressed by the control circuit 580. In certain embodiments, the fixture 510 may be self-ballasted. In certain embodiments, a control circuit 580 may include a current supply circuit configured to independently apply an on-state drive current to each individual solid state chip responsive to a control signal, and may include one or more control elements configured to selectively provide control signals to the current supply circuit. As solid state emitters (e.g., LEDs) are current-controlled devices, the intensity of the light emitted from an electrically activated solid state emitter (e.g., LED) is related to the amount of current with which the device is driven. A common method for controlling the current driven through an LED to achieve desired intensity and/or color mixing is a Pulse Width Modulation (PWM) scheme, which alternately pulses the LEDs to a full current "ON" state followed by a zero current "OFF" state. The control circuit 580 may be configured to control the current driven through the solid state emitter chips 564A-864D associated with the lamps 570-1 to 570-6 using one or more control schemes known in the art. The control circuit 580 may be attached to an opposite or back surface of the mounting plate 575, or may be provided in an enclosure or other structure (not shown) that is segregated from the fixture 500.

While not illustrated in FIG. 13, the light fixture 510 may further include one or more heat spreading components and/or heatsinks for spreading and/or removing heat emitted by solid state emitter chips 564A-864D associated with the lamps 570-1 to 570-6. For example, a heat spreading component may include a sheet of thermally conductive material configured to conduct heat generated by the solid state emitter chips 564A-864D of the light fixture 510 and spread the conducted heat over the area of the mounting plate 575 to reduce thermal stratification in the light fixture 510.

FIG. 14 illustrates a lighting apparatus (e.g., light fixture) 610 according to at least one embodiment. The apparatus includes multiple solid state emitter lamps 600A-600X (which may optionally be embodied in solid state emitter packages or clusters) each including multiple solid state light emitting chips (e.g., LEDs) 648A-648X—with each lamp 600A-600X embodying one or more LED components as described previously herein. Each lamp 600A-600X preferably includes multiple emitters arranged to generate spectral output including different peak wavelengths. (Although six lamps 600A-600X are shown, it is to be appreciated that any desirable number of clusters may be provided, as represented by the variable "X"). In certain embodiments, each lamp 600A-600X may embody an individually temperature compensated lamp. Each lamp 600A-600X may preferably (but not necessarily) include a single submount 642A-642X to which the multiple LEDs 648A-648X are mounted or otherwise supported. The lighting device 610 includes a body structure or substrate 611 to which each lamp 600A-600X may be mounted, with each lamp 600A-600X optionally being arranged in conductive thermal communication with a single heatsink 618 and further arranged to emit light to be diffused by a single diffuser or other optical element 617. The lighting device 610 is preferably self-ballasted. Power may be supplied to the lighting device via contacts 616 (e.g., as may be embodied in a single anode and single cathode, or multiple anodes and cathodes). A power conditioning circuit 612 may provide AC/DC conversion utility, voltage conversion, and/or filtering utility. At least control circuit 614 may be provided to control operation (e.g., control dimming) of one or more lamps 600A-600X or subgroups thereof. In certain embodiments, each lamp 600A-600X may include one or more emitters of a first LED component and one or more emitters of a second LED component. In other embodiments, each lamp 600A-600X may include emitters of either a first LED component or a second LED component, but not emitters of both LED components within the same specific lamp 600A-600X. In one or more photosensors or light sensing elements (not shown) may be arranged to receive emissions from one or more clusters 600A-600X, with an output signal of the one or more light sensing elements being used to control or adjust operation of the lamps 600A-600X, such as to ensure attainment of a desired output color point or output color temperature by the lamps 600A-600X. In certain embodiments, at least one aggregate color point may be on or near the WBL.

FIG. 15 illustrates a first light bulb 700 arranged to incorporate multiple solid state emitters as disclosed herein. In certain embodiments, different solid state emitters or groups of solid state emitters (optionally including one or more lumiphoric materials) of the light bulb 700 may be controlled (e.g., adjusted) to produce different mixtures of light having different color points, with at least one color point preferably being on or near the WBL as described herein. The solid state light bulb 700 includes a conventional power supply 704, and includes a heatsink 705 including fins to promote cooling of the emitter chips 702 and power supply 704. A lateral contact 710 and foot contact 711 may be compatible with an Edison-style screw-type light socket for conducting power to the light bulb 700. An optical element 708 (which may be embodied in a light-transmissive globe) is provided to protect the emitter chips 702 and provide light shaping and/or diffusion utility for light emissions of the bulb 700. One or more lumiphoric materials may be associated with the emitter chips 702 and/or the optical element 708 to provide wavelength conversion utility. Optionally, one or more filtering materials (e.g., notch filtering materials) may be associated with the emitter chips and/or the optical element 708 to filter light emissions in order to exhibit at least one spectral notch as described herein. If notch filtering materials are provided, the composition, amount, and/or concentration of such materials may be used to affect emissions of the lighting device to enhance GAI (thereby increasing vividness), optionally in combination with enhanced CRI Ra.

FIG. 16 illustrates a second, reflector-type (i.e. PAR-style) light bulb 800 arranged to incorporate one or more solid state emitters as disclosed herein. In certain embodiments, different solid state emitters or groups of solid state emitters (optionally including one or more lumiphoric materials) of the light bulb 800 may be controlled (e.g., adjusted) to produce different mixtures of light having different color points, with at least one color point preferably being on or near the WBL as described herein. The light bulb 800 includes a reflector 804 and an optical element (e.g., lens) 806 covering a front or light emitting portion of the bulb 800, with the reflector 804 and lens 806 together forming a light-transmissive optical enclosure. An opposing end of the bulb includes contacts 810, 811 (e.g., an Edison-style threaded lateral contact 810 and a foot contact 811) for receiving power from a socket or other receptacle. The bulb 800 includes solid state emitters (e.g., LEDs) (not visible) as previously discussed, and such components optionally may include one or more notch filtering material layers and/or one or more lumiphoric materials. Optionally, one or more filtering materials may be associated with the optical element 806 to affect light emissions. The optical element 806 may alternatively or additionally include light scattering and/or lumiphoric materials in certain embodiments.

FIGS. 17A-17B illustrate a troffer-type (in-ceiling linear) light fixture 900 arranged to incorporate multiple solid state emitters (e.g., LEDs) 926 as disclosed herein. In certain embodiments, one or more lumiphoric materials may be associated with one or more LEDs 926. In certain embodiments, different solid state emitters or groups of solid state emitters (optionally including one or more lumiphoric materials) of the fixture 900 may be controlled (e.g., adjusted) to produce different mixtures of light having different color points, with at least one color point preferably being on or near the WBL. Optionally, the fixture 900 may include one or more notch filtering materials, such as may be associated with solid emitters 926, may be applied to or included in a linear reflector (e.g., e.g., by doping, impregnation, coating, etc.), or may be applied to or integrated with one or more light transmissive lens plates 915, 916 to cause the light emitted from the light fixture to exhibit a spectral notch. Light fixture 900 includes pan 901, heatsink 902, reflector 908, and end caps 910, 911. End cap 910 is larger than end cap 911 and is shaped to act as a circuit box to house electronics used to drive and control the light source (e.g., rectifiers, regulators, timing circuitry, etc.). Although a reflector may take various shapes, in the illustrated embodiment, the reflector 908 includes a flat region opposite the heatsink 902. In alternative embodiments, the reflector 908 could be parabolic in shape, or include two or more parabolic regions. Light fixture 900 also includes a diffuser lens assembly including lens plates 915, 916, disposed adjacent to sides of the heatsink 902. Reflector 908 can be made of many different materials, including metal, polymeric material, microcellular polyethyleneterephthalate (MCPET), or other suitable materials.

In certain embodiments, solid state lighting devices such as disclosed herein may be arranged to output a preferred combination of CRI Ra≥80 and 80≤GAI≤100 and at least 500 lumens with at least two solid state emitters, preferably in combination with at least one lumiphoric material. Such a lighting device may preferably be devoid of any electrically activated solid state light emitter arranged to generate emissions (i) having dominant wavelength in a range of from 430 nm to 480 nm and (ii) exiting the lighting device without passage through a layer or region comprising a lumiphoric material.

FIG. 18A is a table including numerical results for modeling of a solid state lighting device including an orange/red (617 nm dominant wavelength) LED, a blue (455 nm dominant wavelength) LED, and a yellow phosphor (NYAG 7), yielding composite emissions with 521 pupil lumens, a CCT of 2999K, a CRI Ra value of 91, and a GAI value of 83%. For the individual LEDs and the phosphor, FIG. 18A provides CIE 1931 x and y coordinates, CIE 1976 u' and v' coordinates, dominant wavelength, and relative intensity (arbitrary units). For the combined emissions, FIG. 18A further provides CIE 1931 x and y coordinates, CCT, CRI Ra, R9 color rendering, GAI, color quality scale (CQS), S/P ratio, luminous efficacy, du'v' (BBUDLL), and duv values. FIG. 18B is a CIE 1931 chromaticity diagram showing the blackbody locus, a portion of the line of minimum tint (or white body line), and the following items for the LEDs and phosphor of FIG. 18A: tie lines, gamut area, and composite color point (output). As demonstrated in FIG. 18A, a preferred combination of CRI Ra≥80 and 80≤GAI≤100 and device output of greater than 500 (pupil) lumens may be obtained with a lighting device utilizing two LEDs in combination with one lumiphoric material. The resulting color point (as shown by the X symbol in FIG. 18B) is below the blackbody locus and slightly below the white body line. FIGS. 18C-18D embody bar charts providing CRI (and CRI Ra) values and CQS values, respectively, for aggregate emissions of the solid state lighting device according to the modeling results of FIG. 18A.

Embodiments as disclosed herein may provide one or more of the following beneficial technical effects: enabling novel adjustment of color point (optionally in conjunction with high luminous efficacy); enhancing perceived quality of emissions of lighting devices; enhancing vividness of colors represented by lighting devices; and enhancing efficacy of vivid output lighting devices.

Those skilled in the art will recognize improvements and modifications to the preferred embodiments of the present disclosure. All such improvements and modifications are considered within the scope of the concepts disclosed herein and the claims that follow. Any of the various features and elements as disclosed herein may be combined with one or more other disclosed features and elements unless indicated to the contrary herein.

What is claimed is:

1. A solid state lighting device comprising:
a first electrically activated solid state emitter;
a second electrically activated solid state emitter; and
a control circuit configured to adjust aggregated light emissions of the solid state lighting device to move between at least two color points;
wherein at least a first color point of the at least two color points embodies a combination of light exiting the solid state lighting device that was emitted by the first electrically activated solid state emitter and the second electrically activated solid state emitter that produces, in the absence of any additional light, aggregated light emissions (i) having a luminous efficacy of at least 60 lumens per watt, and (ii) having (x, y) coordinates on a 1931 CIE Chromaticity Diagram that define a point on or within 7 MacAdam ellipses of a white body locus embodying a line including segments defined by the following x, y coordinates on a 1931 CIE Chromaticity Diagram: (0.3114, 0.3386) to (0.3462, 0.3631), (0.3462, 0.3631) to (0.3777, 0.3790), (0.3777, 0.3790) to (0.3977, 0.3707), (0.3977, 0.3707) to (0.4211, 0.3713), and (0.4211, 0.3713) to (0.4437, 0.3808).

2. The solid state lighting device according to claim 1, being devoid of any electrically activated solid state light emitter arranged to generate emissions (i) having dominant wavelength in a range of from 430 nm to 480 nm and (ii) exiting the solid state lighting device without passage through a layer or region comprising a lumiphoric material.

3. The solid state lighting device according to claim 1, wherein aggregated light emissions of the solid state lighting device at the at least a first color point comprise a luminous efficacy of at least 60 lumens per watt.

4. The solid state lighting device according to claim 1, wherein aggregated light emissions of the solid state lighting device at the at least a first color point comprise a luminous flux of at least 500 lumens.

5. The solid state lighting device according to claim 1, wherein aggregated light emissions of the solid state lighting device at the at least a first color point comprise a color rendering index (CRI) value of at least 80 and a gamut area index (GAI) value in a range of from 80 to 100.

6. The solid state lighting device according to claim 1, wherein the at least a first color point is at least 7 MacAdam ellipses apart from a Planckian locus definable on a 1931 CIE Chromaticity Diagram.

7. The solid state lighting device according to claim 1, wherein the at least a first color point comprises a correlated color temperature (CCT) value in a range of from 2500K to 4000K.

8. A method of operating a solid state lighting device according to claim 1, the method comprising utilizing the control circuit to move from one to the other of the first color and a second color point of the at least two color points, wherein at least the first color point produces aggregated light emissions (i) having a luminous efficacy of at least 60 lumens per watt, and (ii) having (x, y) coordinates on a 1931 CIE Chromaticity Diagram that define a point on or within 7 MacAdam ellipses of a white body locus embodying a line including segments defined by the following x, y coordinates on a 1931 CIE Chromaticity Diagram: (0.3114, 0.3386) to (0.3462, 0.3631), (0.3462, 0.3631) to (0.3777, 0.3790), (0.3777, 0.3790) to (0.3977, 0.3707), (0.3977, 0.3707) to (0.4211, 0.3713), and (0.4211, 0.3713) to (0.4437, 0.3808).

9. A solid state lighting device comprising:
a first electrically activated solid state emitter;
a second electrically activated solid state emitter; and
a control circuit configured to adjust aggregated light emissions of the solid state lighting device to move between at least two color points;
wherein at least a first color point of the at least two color points embodies a combination of light exiting the solid state lighting device that was emitted by the first and the second electrically activated solid state emitter that produces, in the absence of any additional light, aggregated light emissions having (x, y) coordinates on a 1931 CIE Chromaticity Diagram that define a point on or within 7 MacAdam ellipses of a white body locus embodying a line including segments defined by the following x, y coordinates on a 1931 CIE Chromaticity Diagram: (0.3114, 0.3386) to (0.3462, 0.3631), (0.3462, 0.3631) to (0.3777, 0.3790), (0.3777, 0.3790) to (0.3977, 0.3707), (0.3977, 0.3707) to (0.4211, 0.3713), and (0.4211, 0.3713) to (0.4437, 0.3808); and
wherein the at least two color points are related according to one of the following conditions (a) to (c):
(a) the at least two color points comprise a variation in x coordinate value of (x, y) coordinates on a 1931 CIE Chromaticity Diagram of less than 0.001;
(b) the at least two color points comprise a variation in y coordinate value of (x, y) coordinates on a 1931 CIE Chromaticity Diagram of less than 0.001; and
(c) the at least two color points, when plotted on a CIE 1976 u'-v' chromaticity diagram, differ in Delta u'v' values relative to one another by an amount of no greater than 0.01, and differ in correlated color temperature (CCT) values by an amount of at least 100K relative to one another.

10. The solid state lighting device according to claim 9, wherein the at least two color points comprise a variation in x coordinate value of (x, y) coordinates on a 1931 CIE Chromaticity Diagram of less than 0.001.

11. The solid state lighting device according to claim 10, wherein:

the first electrically activated solid state emitter comprises a first LED including a dominant wavelength in a range of from 430 nm to 480 nm and a first lumiphor arranged to receive and be excited by at least a portion of emissions of the first LED, and emit lumiphor emissions including a dominant wavelength in a range of from 631 nm to 700 nm; and the second electrically activated solid state emitter comprises a second LED including a dominant wavelength in a range of from 506 nm to 560 nm.

12. The solid state lighting device according to claim 9, wherein the at least two color points comprise a variation in y coordinate value of (x, y) coordinates on a 1931 CIE Chromaticity Diagram of less than 0.001.

13. The solid state lighting device according to claim 12, wherein:

the first electrically activated solid state emitter comprises a first LED including a dominant wavelength in a range of from 430 nm to 480 nm and a first lumiphor arranged to receive and be excited by at least a portion of emissions of the first LED, and emit lumiphor emissions including a dominant wavelength in a range of from 590 nm to 630 nm; and the second electrically activated solid state emitter comprises a second LED including a dominant wavelength in a range of from 481 nm to 505 nm.

14. The solid state lighting device according to claim 9, wherein the at least two color points, when plotted on a CIE 1976 u'-v' chromaticity diagram, differ in Delta u'v' values relative to one another by an amount of no greater than 0.01, and differ in correlated color temperature (CCT) values by an amount of at least 100K relative to one another.

15. The solid state lighting device according to claim 9, wherein the at least two color points comprise at least three color points.

16. The solid state lighting device according to claim 9, being devoid of any electrically activated solid state light emitter arranged to generate emissions (i) having dominant wavelength in a range of from 430 nm to 480 nm and (ii) exiting the solid state lighting device without passage through a layer or region comprising a lumiphoric material.

17. The solid state lighting device according to claim 9, wherein aggregated light emissions of the solid state lighting device at the at least a first color point comprise a luminous efficacy of at least 60 lumens per watt.

18. A method of operating a solid state lighting device according to claim 9, the method comprising utilizing the control circuit to move from one to the other of the first color and a second color point of the at least two color points;

wherein at least the first color point embodies a combination of light exiting the solid state lighting device that was emitted by the first and the second electrically activated solid state emitter that produces, in the absence of any additional light, aggregated light emissions having (x, y) coordinates on a 1931 CIE Chromaticity Diagram that define a point on or within 7 MacAdam ellipses of a white body locus embodying a line including segments defined by the following x, y coordinates on a 1931 CIE Chromaticity Diagram: (0.3114, 0.3386) to (0.3462, 0.3631), (0.3462, 0.3631) to (0.3777, 0.3790), (0.3777, 0.3790) to (0.3977, 0.3707), (0.3977, 0.3707) to (0.4211, 0.3713), and (0.4211, 0.3713) to (0.4437, 0.3808); and wherein the first color point and the second color point are related according to one of the following conditions (a) to (c):

(a) the first and second color points comprise a variation in x coordinate value of (x, y) coordinates on a 1931 CIE Chromaticity Diagram of less than 0.001;

(b) the first and second color points comprise a variation in y coordinate value of (x, y) coordinates on a 1931 CIE Chromaticity Diagram of less than 0.001; and (c) the first and second color points, when plotted on a CIE 1976 u'-v' chromaticity diagram, differ in Delta u'v' values relative to one another by an amount of no greater than 0.01, and differ in correlated color temperature (CCT) values by an amount of at least 100K relative to one another.

19. A solid state lighting device comprising:

a first electrically activated solid state emitter;

a second electrically activated solid state emitter; and a control system configured to adjust aggregated light emissions of the solid state lighting device to move between at least two color points;

wherein at least a first color point of the at least two color points embodies a combination of light exiting the solid state lighting device that was emitted by the first electrically activated solid state emitter and the second electrically activated solid state emitter that produces, in the absence of any additional light, aggregated light emissions having (x, y) coordinates on a 1931 CIE Chromaticity Diagram that define a point on or within 7 MacAdam ellipses of a white body locus embodying a line including segments defined by the following x, y coordinates on a 1931 CIE Chromaticity Diagram: (0.3114, 0.3386) to (0.3462, 0.3631), (0.3462, 0.3631) to (0.3777, 0.3790), (0.3777, 0.3790) to (0.3977, 0.3707), (0.3977, 0.3707) to (0.4211, 0.3713), and (0.4211, 0.3713) to (0.4437, 0.3808);

wherein at least a second color point of the at least two color points embodies a combination of light exiting the solid state lighting device that was emitted by the first electrically activated solid state emitter and the second electrically activated solid state emitter that produces, in the absence of any additional light, aggregated light emissions having (x, y) coordinates on a 1931 CIE Chromaticity Diagram that define a point on or within 10 MacAdam ellipses of a Planckian locus; and wherein the at least a first color point and the at least a second color point differ in correlated color temperature (CCT) by a value of less than or equal to 100K relative to one another.

20. The solid state lighting device according to claim 19, being devoid of any electrically activated solid state light emitter arranged to generate emissions (i) having dominant wavelength in a range of from 430 nm to 480 nm and (ii) exiting the solid state lighting device without passage through a layer or region comprising a lumiphoric material.

21. The solid state lighting device according to claim 19, wherein aggregated light emissions of the solid state lighting device at the at least a first color point comprise a luminous efficacy of at least 60 lumens per watt.

22. The solid state lighting device according to claim 19, wherein aggregated light emissions of the solid state lighting device at the at least a first color point comprise a luminous flux of at least 500 lumens.

23. The solid state lighting device according to claim 19, wherein aggregated light emissions of the solid state lighting device at the at least a first color point comprise a color rendering index (CRI) value of at least 50.

24. A method of operating a solid state lighting device according to claim 19, the method comprising utilizing the control system to move from one to the other of the first color and a second color point of the at least two color points;
  wherein at least the first color point embodies a combination of light exiting the solid state lighting device that was emitted by the first electrically activated solid state emitter and the second electrically activated solid state emitter that produces, in the absence of any additional light, aggregated light emissions having (x, y) coordinates on a 1931 CIE Chromaticity Diagram that define a point on or within 7 MacAdam ellipses of a white body locus embodying a line including segments defined by the following x, y coordinates on a 1931 CIE Chromaticity Diagram: (0.3114, 0.3386) to (0.3462, 0.3631), (0.3462, 0.3631) to (0.3777, 0.3790), (0.3777, 0.3790) to (0.3977, 0.3707), (0.3977, 0.3707) to (0.4211, 0.3713), and (0.4211, 0.3713) to (0.4437, 0.3808);
  wherein at least the second color point embodies a combination of light exiting the solid state lighting device that was emitted by the first electrically activated solid state emitter and the second electrically activated solid state emitter that produces, in the absence of any additional light, aggregated light emissions having (x, y) coordinates on a 1931 CIE Chromaticity Diagram that define a point on or within 10 MacAdam ellipses of a Planckian locus; and
  wherein the at least a first color point and the at least a second color point differ in correlated color temperature (CCT) by a value of less than or equal to 100K relative to one another.

25. A solid state lighting device comprising:
  a first electrically activated solid state emitter;
  a second electrically activated solid state emitter; and
  a control system configured to adjust aggregated light emissions of the solid state lighting device to move between at least two color points;
  wherein at least a first color point of the at least two color points embodies a combination of light exiting the solid state lighting device that was emitted by the first electrically activated solid state emitter and the second electrically activated solid state emitter that produces, in the absence of any additional light, aggregated light emissions having a first correlated color temperature (CCT) value and having (x, y) coordinates on a 1931 CIE Chromaticity Diagram that define a point on or within 7 MacAdam ellipses of a white body locus embodying a line including segments defined by the following x, y coordinates on a 1931 CIE Chromaticity Diagram: (0.3114, 0.3386) to (0.3462, 0.3631), (0.3462, 0.3631) to (0.3777, 0.3790), (0.3777, 0.3790) to (0.3977, 0.3707), (0.3977, 0.3707) to (0.4211, 0.3713), and (0.4211, 0.3713) to (0.4437, 0.3808);
  wherein at least a second color point of the at least two color points embodies a combination of light exiting the solid state lighting device that was emitted by the first electrically activated solid state emitter and the second electrically activated solid state emitter that produces, in the absence of any additional light, aggregated light emissions having a second correlated color temperature (CCT) value;
  wherein the first CCT value and the second CCT value differ by at least 500K; and
  wherein aggregated light emissions at the first color point and aggregated light emissions at the second color point differ in luminous flux by at least 30%.

26. The solid state lighting device according to claim 25, being devoid of any electrically activated solid state light emitter arranged to generate emissions (i) having dominant wavelength in a range of from 430 nm to 480 nm and (ii) exiting the solid state lighting device without passage through a layer or region comprising a lumiphoric material.

27. The solid state lighting device according to claim 25, wherein aggregated light emissions of the solid state lighting device at the at least a first color point comprise a luminous efficacy of at least 60 lumens per watt.

28. A method of operating a solid state lighting device according to claim 25, the method comprising utilizing the control system to move from one to the other of the first color point and a second color point of the at least two color points;
  wherein at least the first color point embodies a combination of light exiting the solid state lighting device that was emitted by the first electrically activated solid state emitter and the second electrically activated solid state emitter that produces, in the absence of any additional light, aggregated light emissions having (x, y) coordinates on a 1931 CIE Chromaticity Diagram that define a point on or within 7 MacAdam ellipses of a white body locus embodying a line including segments defined by the following x, y coordinates on a 1931 CIE Chromaticity Diagram: (0.3114, 0.3386) to (0.3462, 0.3631), (0.3462, 0.3631) to (0.3777, 0.3790), (0.3777, 0.3790) to (0.3977, 0.3707), (0.3977, 0.3707) to (0.4211, 0.3713), and (0.4211, 0.3713) to (0.4437, 0.3808);
  wherein at least the second color point embodies a combination of light exiting the solid state lighting device that was emitted by the first electrically activated solid state emitter and the second electrically activated solid state emitter that produces, in the absence of any additional light, aggregated light emissions having a second correlated color temperature (CCT) value;
  wherein the first CCT value and the second CCT value differ by at least 500K; and
  wherein aggregated light emissions at the first color point and aggregated light emissions at the second color point differ in luminous flux by at least 30%.

29. A solid state lighting device comprising:
  at least one first electrically activated solid state light emitter arranged to produce, in the absence of any additional light, light emissions within a first bin defining a first continuous region occupying an area not exceeding 10% of a 1931 CIE Chromaticity Diagram;
  at least one second electrically activated solid state light emitter arranged to produce, in the absence of any additional light, light emissions within a second bin defining a second continuous region occupying an area not exceeding 10% of a 1931 CIE Chromaticity Diagram, wherein the second continuous region is non-overlapping with the first continuous region, and the at least one first electrically activated solid state light emitter is independently controllable relative to the at least one second electrically activated solid state light emitter;
  a control circuit configured to adjust aggregated light emissions of the solid state lighting device to move between at least two color points;
  wherein at least a first color point of the at least two color points embodies a combination of light exiting the solid state lighting device that was emitted by the at least one first electrically activated solid state emitter and the at least one second electrically activated solid state emitter that produces, in the absence of any additional light, aggregated light emissions having (x, y) coordinates on a 1931 CIE Chromaticity Diagram that define a point on or within 7 MacAdam ellipses of a white body locus embodying a line including segments defined by the following x, y coordinates on a 1931 CIE Chromaticity Diagram: (0.3114, 0.3386) to (0.3462, 0.3631), (0.3462, 0.3631) to (0.3777, 0.3790), (0.3777, 0.3790) to (0.3977, 0.3707), (0.3977, 0.3707) to (0.4211, 0.3713), and (0.4211, 0.3713) to (0.4437, 0.3808); and wherein the solid state lighting device is devoid of any electrically activated solid state light emitter arranged to produce, in the absence of any additional light, light emissions outside either the first bin or the second bin.

30. The solid state lighting device according to claim 29, wherein area of each of the first bin and the second bin is non-overlapping with a Planckian locus definable on a 1931 CIE Chromaticity Diagram.

31. The solid state lighting device according to claim 29, being devoid of any electrically activated solid state light emitter arranged to generate emissions (i) having dominant wavelength in a range of from 430 nm to 480 nm and (ii) exiting the solid state lighting device without passage through a layer or region comprising a lumiphoric material.

32. The solid state lighting device according to claim 29, wherein aggregated emissions at the at least a first point comprise a luminous efficacy of at least 60 lumens per watt.

33. A solid state lighting device comprising:
at least one first electrically activated solid state light emitter arranged to produce, in the absence of any additional light, light emissions within a first bin defining a first continuous region occupying an area not exceeding 10% of a 1931 CIE Chromaticity Diagram;
at least one second electrically activated solid state light emitter arranged to produce, in the absence of any additional light, light emissions within a second bin defining a second continuous region occupying an area not exceeding 10% of a 1931 CIE Chromaticity Diagram; and
a first power line, wherein each of the at least one first and the at least one second solid state light emitter is electrically connected to the first power line;
wherein the second continuous region is non-overlapping with the first continuous region, and the at least one first electrically activated solid state light emitter is independently controllable relative to the at least one second electrically activated solid state light emitter;
wherein a combination of light exiting the solid state lighting device that was emitted by the first electrically activated solid state emitter and the second electrically activated solid state emitter produces, in the absence of any additional light, aggregated light emissions having (x, y) coordinates on a 1931 CIE Chromaticity Diagram that define a color point on or within 7 MacAdam ellipses of a white body locus embodying a line including segments defined by the following x, y coordinates on a 1931 CIE Chromaticity Diagram: (0.3114, 0.3386) to (0.3462, 0.3631), (0.3462, 0.3631) to (0.3777, 0.3790), (0.3777, 0.3790) to (0.3977, 0.3707), (0.3977, 0.3707) to (0.4211, 0.3713), and (0.4211, 0.3713) to (0.4437, 0.3808); and wherein the solid state lighting device is devoid of any electrically activated solid state light emitter arranged to produce, in the absence of any additional light, light emissions outside either the first bin or the second bin.

34. The solid state lighting device according to claim 33, wherein area of each of the first bin and the second bin is non-overlapping with a Planckian locus definable on a 1931 CIE Chromaticity Diagram.

35. The solid state lighting device according to claim 33, being devoid of any electrically activated solid state light emitter arranged to generate emissions (i) having dominant wavelength in a range of from 430 nm to 480 nm and (ii) exiting the solid state lighting device without passage through a layer or region comprising a lumiphoric material.

36. The solid state lighting device according to claim 33, wherein aggregated light emissions of the solid state lighting device at the color point comprise a luminous efficacy of at least 60 lumens per watt.

37. A method of operating a solid state lighting device according to claim 29, the method comprising utilizing the control circuit to move from one to the other of the first color and a second color point of the at least two color points;
wherein at least the first color point embodies a combination of light exiting the solid state lighting device that was emitted by the first electrically activated solid state emitter and the second electrically activated solid state emitter that produces, in the absence of any additional light, aggregated light emissions having (x, y) coordinates on a 1931 CIE Chromaticity Diagram that define a point on or within 7 MacAdam ellipses of a white body locus embodying a line including segments defined by the following x, y coordinates on a 1931 CIE Chromaticity Diagram: (0.3114, 0.3386) to (0.3462, 0.3631), (0.3462, 0.3631) to (0.3777, 0.3790), (0.3777, 0.3790) to (0.3977, 0.3707), (0.3977, 0.3707) to (0.4211, 0.3713), and (0.4211, 0.3713) to (0.4437, 0.3808).

* * * * *